US010453866B2

(12) United States Patent
Umezaki

(10) Patent No.: US 10,453,866 B2
(45) Date of Patent: *Oct. 22, 2019

(54) SEMICONDUCTOR DEVICE AND ELECTRONIC DEVICE

(71) Applicant: Semiconductor Energy Laboratory Co., Ltd., Kanagawa-ken (JP)

(72) Inventor: Atsushi Umezaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 222 days.

This patent is subject to a terminal disclaimer.

(21) Appl. No.: 15/588,955

(22) Filed: May 8, 2017

(65) Prior Publication Data

US 2017/0243892 A1  Aug. 24, 2017

Related U.S. Application Data

(63) Continuation of application No. 14/623,193, filed on Feb. 16, 2015, now Pat. No. 9,653,490.

(30) Foreign Application Priority Data

Feb. 21, 2014  (JP) .................... 2014-031501

(51) Int. Cl.
  G11C 19/00    (2006.01)
  H01L 27/12    (2006.01)
  (Continued)

(52) U.S. Cl.
  CPC .......... H01L 27/124 (2013.01); G09G 3/20 (2013.01); G11C 19/28 (2013.01);
  (Continued)

(58) Field of Classification Search
None
See application file for complete search history.

(56) References Cited

U.S. PATENT DOCUMENTS 6,426,743 B1   7/2002  Yeo et al.
6,538,955 B2   3/2003  Kohno
               (Continued)

FOREIGN PATENT DOCUMENTS

CN    101154343 A    4/2008
CN    102222480 A    10/2011
               (Continued)

OTHER PUBLICATIONS

Taiwanese Office Action re Application No. TW 104101812, dated Apr. 27, 2018.

(Continued)

Primary Examiner — Tuan T Lam
(74) Attorney, Agent, or Firm — Husch Blackwell LLP

(57) ABSTRACT

To provide a novel shift register. Transistors 101 to 104 are provided. A first terminal of the transistor 101 is connected to a wiring 111 and a second terminal of the transistor 101 is connected to a wiring 112. A first terminal of the transistor 102 is connected to a wiring 113 and a second terminal of the transistor 102 is connected to the wiring 112. A first terminal of the transistor 103 is connected to the wiring 113 and a gate of the transistor 103 is connected to the wiring 111 or a wiring 119. A first terminal of the transistor 104 is connected to a second terminal of the transistor 103, a second terminal of the transistor 104 is connected to a gate of the transistor 101, and a gate of the transistor 104 is connected to a gate of the transistor 102.

18 Claims, 19 Drawing Sheets

(51) Int. Cl.
*H01L 29/786* (2006.01)
*H01L 29/10* (2006.01)
*G11C 19/28* (2006.01)
*H03K 19/003* (2006.01)
*G09G 3/20* (2006.01)
G09G 3/3266 (2016.01)
G09G 3/36 (2006.01)
G02F 1/133 (2006.01)

(52) U.S. Cl.
CPC ...... *H01L 27/1225* (2013.01); *H01L 29/1033* (2013.01); *H01L 29/7869* (2013.01); *H03K 19/00346* (2013.01); *G02F 1/13306* (2013.01); *G09G 3/3266* (2013.01); *G09G 3/3674* (2013.01); *G09G 3/3677* (2013.01); *G09G 2300/0809* (2013.01); *G09G 2310/0267* (2013.01); *G09G 2310/0286* (2013.01); *G09G 2330/021* (2013.01)

(56) References Cited

U.S. PATENT DOCUMENTS

| | | | |
|---|---|---|---|
| 7,038,653 B2 | 5/2006 | Moon |
| 7,486,269 B2 | 2/2009 | Moon |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,019,039 B1 | 9/2011 | Tsai |
| 8,054,279 B2 | 11/2011 | Umezaki et al. |
| 8,134,156 B2 | 3/2012 | Akimoto |
| 8,158,464 B2 | 4/2012 | Akimoto |
| 8,274,077 B2 | 9/2012 | Akimoto et al. |
| 8,319,528 B2 | 11/2012 | Kimura et al. |
| 8,368,079 B2 | 2/2013 | Akimoto |
| 8,415,665 B2 | 4/2013 | Kimura et al. |
| 8,466,463 B2 | 6/2013 | Akimoto et al. |
| 8,471,620 B2 | 6/2013 | Koyama et al. |
| 8,519,929 B2 | 8/2013 | Umezaki |
| 8,525,165 B2 | 9/2013 | Akimoto |
| 8,564,523 B2 | 10/2013 | Moon |
| 8,605,073 B2 | 12/2013 | Umezaki et al. |
| 8,624,656 B2 | 1/2014 | Koyama et al. |
| 8,629,069 B2 | 1/2014 | Akimoto et al. |
| 8,664,981 B2 | 3/2014 | Kimura et al. |
| 8,669,550 B2 | 3/2014 | Akimoto et al. |
| 8,698,551 B2 | 4/2014 | Umezaki |
| 8,743,044 B2 | 6/2014 | Umezaki et al. |
| 8,790,959 B2 | 7/2014 | Akimoto et al. |
| 8,796,069 B2 | 8/2014 | Akimoto et al. |
| 8,872,572 B2 | 10/2014 | Koyama et al. |
| 8,890,146 B2 | 11/2014 | Kimura et al. |
| 8,902,145 B2 | 12/2014 | Umezaki et al. |
| 9,135,878 B2 | 9/2015 | Kim |
| 9,171,868 B2 | 10/2015 | Kimura et al. |
| 9,276,122 B2 | 3/2016 | Yokozeki |
| 9,337,191 B2 | 5/2016 | Umezaki et al. |
| 9,349,757 B2 | 5/2016 | Kimura et al. |
| 9,536,903 B2 | 1/2017 | Umezaki et al. |
| 9,601,073 B2 | 3/2017 | Chae |
| 9,735,180 B2 | 8/2017 | Kimura et al. |
| 9,842,861 B2 | 12/2017 | Umezaki et al. |
| 10,002,888 B2 | 6/2018 | Kimura et al. |
| 2004/0227718 A1 | 11/2004 | Park |
| 2006/0001637 A1 | 1/2006 | Pak et al. |
| 2008/0158133 A1* | 7/2008 | Ieong .................. G09G 3/3648 345/100 |
| 2008/0187089 A1 | 8/2008 | Miyayama et al. |
| 2009/0305461 A1 | 12/2009 | Akimoto et al. |
| 2010/0084651 A1 | 4/2010 | Yamazaki et al. |
| 2010/0141641 A1 | 6/2010 | Furuta et al. |
| 2010/0272228 A1 | 10/2010 | Hsiao et al. |
| 2011/0044423 A1 | 2/2011 | Lin et al. |
| 2011/0255653 A1 | 10/2011 | Chae |
| 2013/0223584 A1 | 8/2013 | Umezaki |
| 2013/0334527 A1 | 12/2013 | Umezaki |
| 2014/0078029 A1 | 3/2014 | Jang |
| 2014/0119491 A1 | 5/2014 | Liu |
| 2014/0247070 A1 | 9/2014 | Umezaki |
| 2016/0254281 A1 | 9/2016 | Umezaki et al. |
| 2018/0158839 A1 | 6/2018 | Umezaki et al. |

FOREIGN PATENT DOCUMENTS

| | | |
|---|---|---|
| CN | 102637745 A | 8/2012 |
| EP | 1 906 414 A2 | 4/2008 |
| EP | 3 223 283 A2 | 9/2017 |
| JP | 2002-074950 A | 3/2002 |
| JP | 2004-103226 A | 4/2004 |
| JP | 2005-050502 A | 2/2005 |
| JP | 2011-141543 A | 7/2011 |
| JP | 2011-191754 A | 9/2011 |
| JP | 2014-063121 A | 4/2014 |
| WO | WO 2011/070929 A1 | 6/2011 |
| WO | WO 2011/102227 A1 | 8/2011 |

OTHER PUBLICATIONS

Chinese Office Action re Application No. CN 201510087445.2, dated Jun. 14, 2018.

* cited by examiner

SEMICONDUCTOR DEVICE AND ELECTRONIC DEVICE

BACKGROUND OF THE INVENTION

This application is a continuation of U.S. application Ser. No. 14/623,193, filed on Feb. 16, 2015 (now U.S. Pat No. 9,653,490) which is incorporated herein by reference.

1. Field of the Invention

One embodiment of the present invention relates to a semiconductor device, a display device, a display module, and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

In recent years, a shift register formed using transistors having the same conductivity type has been developed. Patent Documents 1 and 2 disclose techniques relating to such a shift register.

REFERENCE

Patent Document

[Patent Document 1] Japanese Published Patent Application No. 2004-103226
[Patent Document 2] Japanese Published Patent Application No. 2005-050502

SUMMARY OF THE INVENTION

In the shift register in FIG. 7 in Patent Document 1, by turning on the transistor M2, a voltage VOFF is output. However, in a period during which GOUT[N-1] is at high level, the transistor M2 is turned off; thus, a period during which the voltage VOFF is output is short. Furthermore, since a gate of the transistor M2 is connected to a gate of the transistor M4, the transistor M2 is turned on and thus the transistor M4 is also turned on. Accordingly, in the period during which GOUT[N-1] is at high level, when the transistor M2 is turned on, the shift register does not function.

In the shift register in FIG. 7 in Patent Document 2, by turning on the transistor Q53 or the transistor Q56, a voltage VOFF is output. In a period during which the signal IN1 is at high level, the transistor Q53 is off and the transistor Q56 is on; thus, the voltage VOFF is output. However, to achieve this, the two transistors (the transistor Q53 and the transistor Q56) are needed, and thus, the number of transistors is large.

An object of one embodiment of the present invention is to provide a novel circuit configuration. In particular, an object of one embodiment of the present invention is to provide a novel circuit configuration which can be used for part of a shift register or part of a sequential circuit included in the shift register. Another object of one embodiment of the present invention is to increase a period during which voltage is output or to provide a circuit configuration capable of achieving it. Another object of one embodiment of the present invention is to increase a period during which a transistor for outputting voltage is on or to provide a circuit configuration capable of achieving it. Another object of one embodiment of the present invention is to reduce the number of transistors. Another object of one embodiment of the present invention is to reduce power consumption. Another object of one embodiment of the present invention is to reduce layout area. Another object of one embodiment of the present invention is to reduce the number of manufacturing steps. Another object of one embodiment of the present invention is to reduce manufacturing costs.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including first to fourth transistors. One of a source and a drain of the first transistor is electrically connected to a first wiring. The other of the source and the drain of the first transistor is electrically connected to a second wiring. One of a source and a drain of the second transistor is electrically connected to a third wiring. The other of the source and the drain of the second transistor is electrically connected to the second wiring. One of a source and a drain of the third transistor is electrically connected to the third wiring. One of a source and a drain of the fourth transistor is electrically connected to the other of the source and the drain of the third transistor. The other of the source and the drain of the fourth transistor is electrically connected to a gate of the first transistor. A gate of the fourth transistor is electrically connected to a gate of the second transistor.

In the above semiconductor device, a gate of the third transistor may be connected to the first wiring.

In the above semiconductor device, the gate of the third transistor may be electrically connected to a fourth wiring.

In the above semiconductor device, channel width (W)/channel length (L) of the fourth transistor may be higher than W/L of the third transistor.

In the above semiconductor device, an area of the fourth transistor where a semiconductor layer and a gate electrode overlap with each other may be larger than an area of the third transistor where a semiconductor layer and a gate electrode overlap with each other.

In the above semiconductor device, at least one of the first to fourth transistors may include a channel formation region in an oxide semiconductor.

According to one embodiment of the present invention, a novel circuit configuration can be provided.

BRIEF DESCRIPTION OF THE DRAWINGS

In the accompanying drawings.

DETAILED DESCRIPTION OF THE INVENTION

Figure 1:
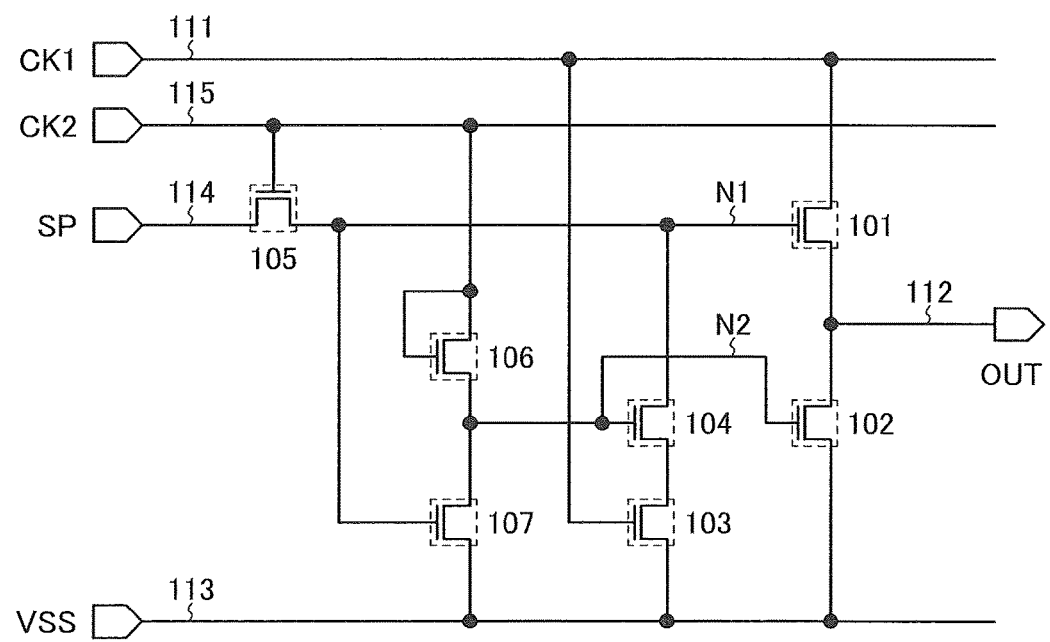
FIG. 1 is a circuit diagram of a sequential circuit.

Embodiments of the present invention are described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

One embodiment of the present invention includes, in its category, any semiconductor device using a transistor, such as an integrated circuit, an RF tag, and a semiconductor display device. The integrated circuits include, in its category, large scale integrated circuits (LSIs) including a microprocessor, an image processing circuit, a digital signal processor (DSP), a microcontroller, and the like, and programmable logic devices (PLDs) such as a field programmable gate array (FPGA) and a complex PLD (CPLD). Furthermore, the semiconductor display device includes, in its category, semiconductor display devices in which circuit elements including semiconductor films are included in driver circuits, such as liquid crystal display devices, light-emitting devices in which a light-emitting element typified by an organic light-emitting element (OLED) is provided in each pixel, electronic paper, digital micromirror devices (DMDs), plasma display panels (PDPs), and field emission displays (FEDs).

In this specification, the semiconductor display device includes, in its category, panels in which a display element such as a liquid crystal element or a light-emitting element is provided for each pixel, and modules in which an IC or the like including a controller is mounted on the panel.

For example, in this specification and the like, when it is explicitly described that X and Y are connected, the case where X and Y are electrically connected, the case where X and Y are functionally connected, and the case where X and Y are directly connected are included therein. Accordingly, a connection relation other than connection relations shown in the drawings and texts is also included, without being limited to a predetermined connection relation, for example, a connection relation shown in the drawings and texts.

Here, each of X and Y denotes an object (e.g., a device, an element, a circuit, a wiring, an electrode, a terminal, a conductive film, a layer, or the like).

In the case where X and Y are electrically connected, one or more elements (e.g., a switch, a transistor, a capacitor, an inductor, a resistor, a diode, a display element, a light-emitting element, and a load) that enable an electrical connection between X and Y can be connected between X and Y, for example. Note that the switch is controlled to be turned on or off. That is, the switch has a function of determining whether current flows or not by being turned on or off (becoming an on state or an off state). Alternatively, the switch has a function of selecting and changing a current path.

In the case where X and Y are functionally connected, one or more circuits (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; and a control circuit) that enable a functional connection between X and Y can be connected between X and Y, for example. Note that for example, in the case where a signal output from X is transmitted to Y even when another circuit is interposed between X and Y, X and Y are functionally connected.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another element or another circuit provided therebetween), and the case where X and Y are directly connected (i.e., the case where X and Y are connected without another element or another circuit provided therebetween) are included therein. That is, when it is explicitly described that "X and Y are electrically connected", the description is the same as the case where it is explicitly only described that "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, each of X, Y, Z1, and Z2 denotes an object (e.g., a device, an element, a circuit, a wiring, an electrode, a terminal, a conductive film, a layer, or the like).

Note that a "source" of a transistor means a source region that is part of a semiconductor film functioning as an active layer or a source electrode electrically connected to the semiconductor film. Similarly, a "drain" of a transistor means a drain region that is part of a semiconductor film functioning as an active layer or a drain electrode electrically connected to the semiconductor film. A "gate" means a gate electrode.

The terms "source" and "drain" of a transistor interchange with each other depending on the type of the channel of the transistor or levels of potentials supplied to the terminals. In general, in an n-channel transistor, a terminal to which a lower potential is supplied is called a source, and a terminal to which a higher potential is supplied is called a drain. Furthermore, in a p-channel transistor, a terminal to which a lower potential is supplied is called a drain, and a terminal to which a higher potential is supplied is called a source. In this specification, although connection relation of the transistor is described assuming that the source and the drain are fixed in some cases for convenience, actually, the names of the source and the drain interchange with each other depending on the relation of the potentials.

(Embodiment 1)

In this embodiment, a sequential circuit (also referred to as a semiconductor device) is described.

An example of a configuration of a sequential circuit is described with reference to FIG. 1. FIG. 1 illustrates an example of a circuit diagram of a sequential circuit. The sequential circuit in FIG. 1 includes transistors 101 to 107 and wirings 111 to 115.

The transistors 101 to 107 in FIG. 1 are n-channel transistors. However, one embodiment of the present invention is not limited thereto, and the transistors 101 to 107 may be p-channel transistors. In the case where the transistors 101 to 107 have the same conductivity type, manufacturing steps can be simplified and manufacturing costs can be reduced as compared to CMOS circuits.

When the transistors 101 to 107 are n-channel transistors, an oxide semiconductor, amorphous silicon, or microcrystalline silicon can be used for a channel formation region. Thus, manufacturing steps can be simplified and manufacturing costs can be reduced as compared to the case where microcrystalline silicon is used for the channel formation region. In particular, when an oxide semiconductor is used for the channel formation region, the off-state currents of the transistors 101 to 107 can be extremely small; thus, power consumption can be reduced.

Connection relations of the transistors are described. A first terminal and a second terminal of the transistor 101 are connected to the wiring 111 and the wiring 112, respectively. A first terminal and a second terminal of the transistor 102 are connected to the wiring 113 and the wiring 112, respectively. A first terminal and a gate of the transistor 103 are connected to the wiring 113 and the wiring 111, respectively. A first terminal, a second terminal, and a gate of the transistor 104 are connected to a second terminal of the transistor 103, a gate of the transistor 101, and a gate of the transistor 102, respectively. A first terminal, a second terminal, and a gate of the transistor 105 are connected to the wiring 114, the gate of the transistor 101, and the wiring 115, respectively. A first terminal, a second terminal, and a gate of the transistor 106 are connected to the wiring 115, the gate of the transistor 102, and the wiring 115, respectively. A first terminal, a second terminal, and a gate of the transistor 107 are connected to the wiring 113, the gate of the transistor 102, and the gate of the transistor 101, respectively. In this manner, a novel circuit configuration can be provided.

Note that the gate of the transistor 101 is denoted by a node N1, and the gate of the transistor 102 is denoted by a node N2.

Next, an example of a signal or voltage which is input to each wiring is described. A signal CK1 is input to the wiring 111, a voltage VSS is input to the wiring 113, a signal SP is input to the wiring 114, and a signal CK2 is input to the wiring 115. A signal OUT is output to the wiring 112 on the basis of the signal CK1, the signal CK2, and the signal SP. A clock signal may be used as the signal CK1 and the signal CK2. The signal CK1 and the signal CK2 have phases different from each other. As the signal SP, a start pulse (also referred to as a set signal) may be used. As the voltage VSS, a power supply voltage or a ground voltage may be used. The signal OUT is an output signal of the sequential circuit.

For convenience, a high-level potential and a low-level potential of each of the signal CK1, the signal CK2, and the signal SP are VDD (VDD>VSS) and VSS, respectively.

Note that one embodiment of the present invention includes the case where a signal, voltage, or the like is not input to wirings in its category. For example, any wiring can be used as long as the signal or the voltage can be input.

Next, the function of each transistor is described.

The transistor 101 controls conduction and non-conduction between the wiring 111 and the wiring 112 on the basis of the potential of the node N1. Furthermore, the transistor 101 supplies the signal CK1 to the wiring 112 on the basis of the potential of the node N1 so that the signal OUT is set at high level.

The transistor 102 controls conduction and non-conduction between the wiring 113 and the wiring 112 on the basis of the potential of the node N2. Furthermore, the transistor 102 supplies the voltage VSS to the wiring 112 on the basis of the potential of the node N2 so that the signal OUT is set at low level.

The transistor 103 controls conduction and non-conduction between the wiring 113 and the first terminal of the transistor 104 on the basis of the signal CK1. The transistor 104 controls conduction and non-conduction between the second terminal of the transistor 103 and the node N1 on the basis of the potential of the node N2. In other words, a circuit including the transistor 103 and the transistor 104 controls conduction and non-conduction between the wiring 113 and the node N1 on the basis of the signal CK1 and the potential of the node N2. The circuit including the transistor 103 and the transistor 104 supplies the voltage VSS to the node N1 on the basis of the signal CK1 and the potential of the node N2 so that the potential of the node N1 is set to a value by which the transistor 101 is turned off.

The transistor 105 controls conduction and non-conduction between the wiring 114 and the node N1 on the basis of the signal CK2. Furthermore, the transistor 105 supplies the signal SP to the node N1 on the basis of the signal CK2 so that the potential of the node N1 is set to a value by which the transistor 101 is turned on. After that, the transistor 105 stops supplying the signal SP to the node N1, so that the node N1 is set in a floating state.

The transistor 106 controls conduction and non-conduction between the wiring 115 and the node N2 on the basis of the signal CK2. Furthermore, the transistor 106 supplies the signal CK2 to the node N2 on the basis of the signal CK2 so that the potential of the node N2 is set to a value by which the transistor 102 and the transistor 104 are turned on.

Figure 2:
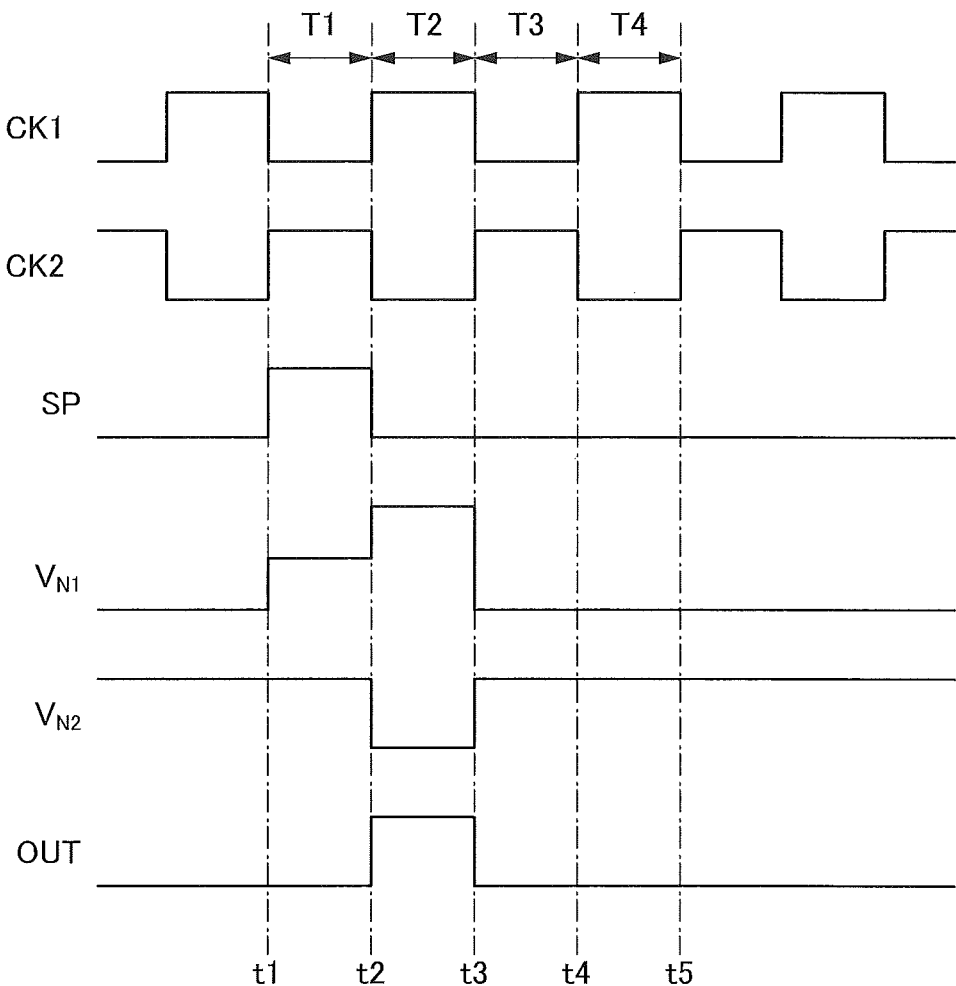
FIG. 2 is a timing chart of a sequential circuit.
Figure 3A:
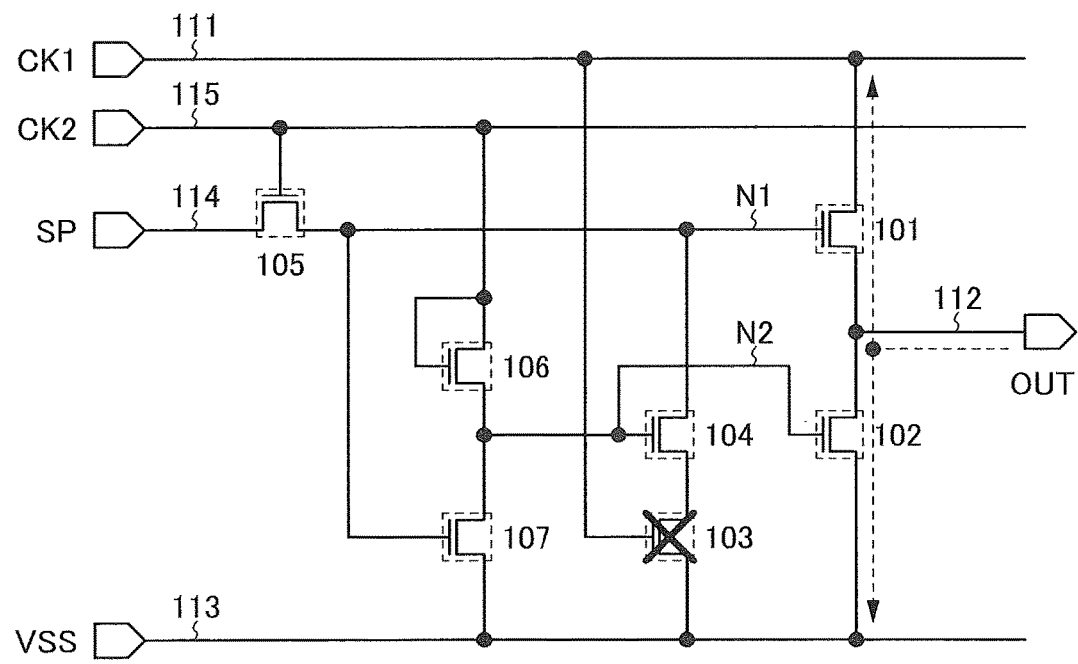
FIGS. 3A and 3B are circuit diagrams of the sequential circuit.
Figure 3B:
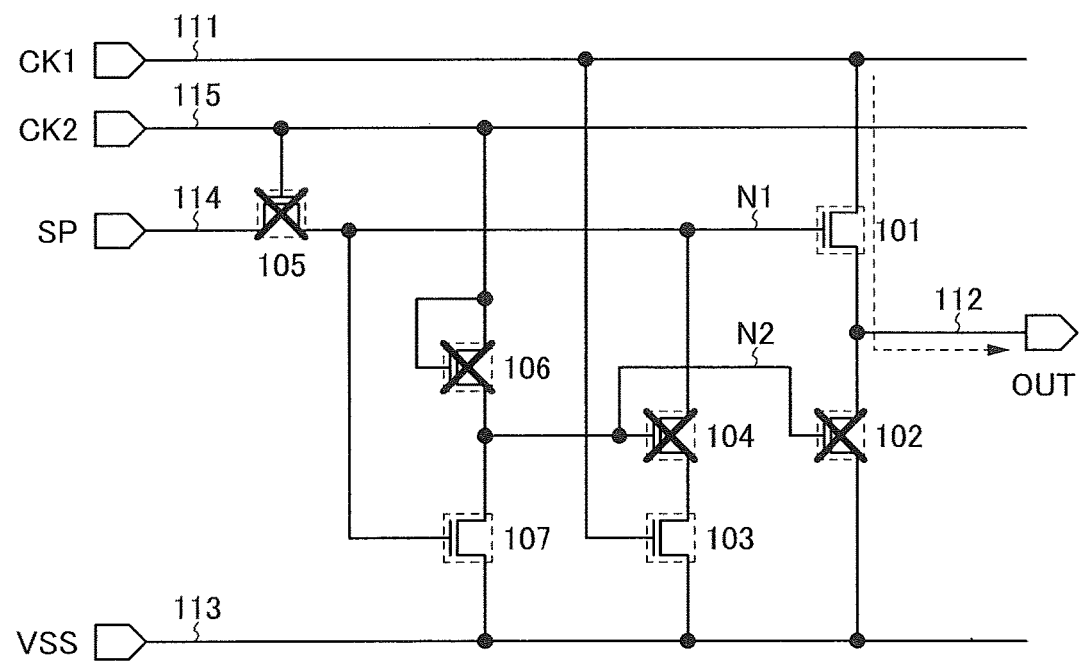
Figure 4A:
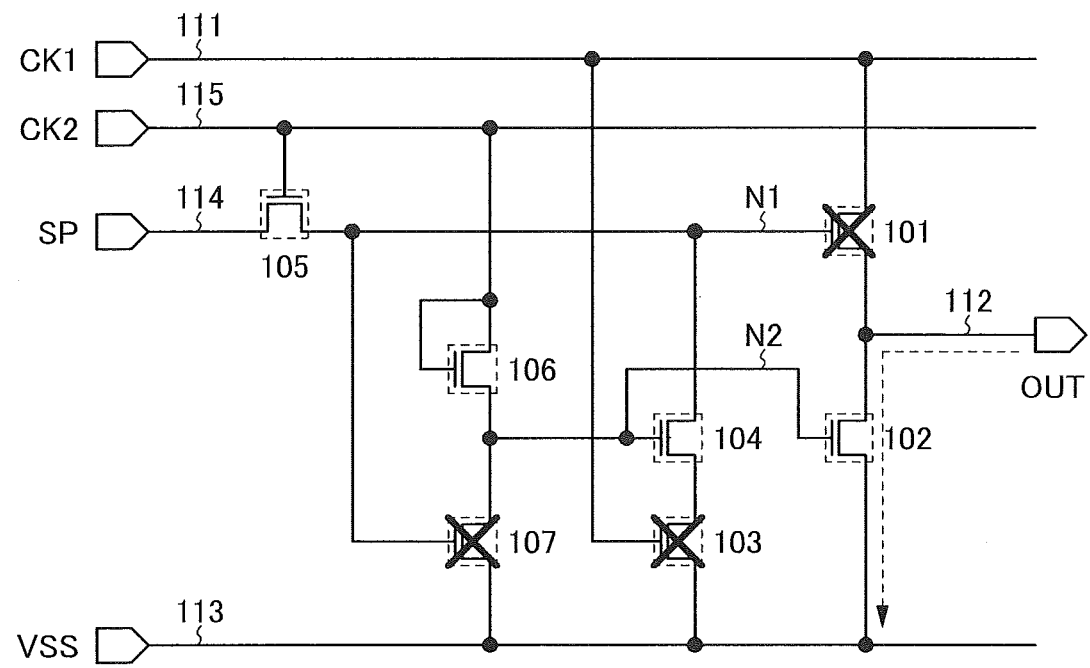
FIGS. 4A and 4B are circuit diagrams of the sequential circuit.
Figure 4B:
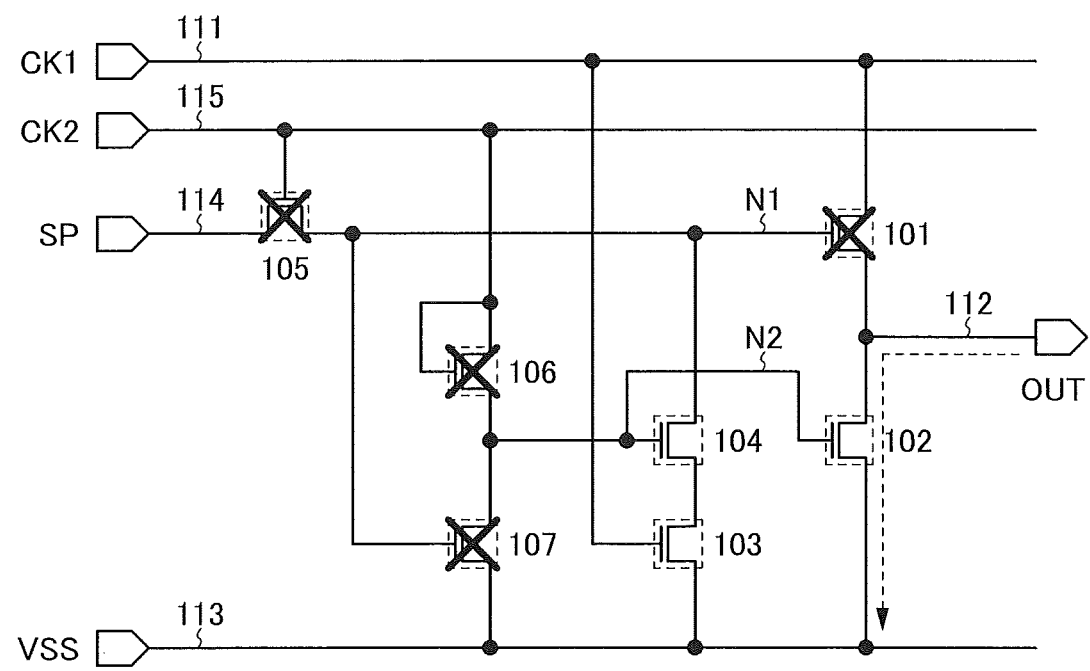

The transistor 107 controls conduction and non-conduction between the wiring 113 and the node N2 on the basis of the potential of the node N1. Furthermore, the transistor 107 supplies the voltage VSS to the node N2 on the basis of the potential of the node N1 so that the potential of the node N2 is set to a value by which the transistor 102 and the transistor 104 are turned off An operation example of the sequential circuit in FIG. 1 is described with reference to FIG. 2, FIGS. 3A and 3B, and FIGS. 4A and 4B. FIG. 2 is a timing chart showing an example of the signal CK1, the signal CK2, the signal SP, the potential of the node N1 ($V_{N1}$), the potential of the node N2 ($V_{N2}$), and the signal OUT. FIG. 3A is a schematic diagram of an operation from a time t1 to a time t2 (also referred to as a period T1), FIG. 3B is a schematic diagram of an operation from a time t2 to a time t3 (also referred to as a period T2), FIG. 4A is a schematic diagram of an operation from a time t3 to a time t4 (also referred to as a period T3), and FIG. 4B is a schematic diagram of an operation from a time t4 to a time t5 (also referred to as a period T4).

Note that a period during which each of the signal CK1 and the signal CK2 is at high level and a period during which each of the signal CK1 and the signal CK2 is at low level in FIG. 2 are the same length in one cycle, and a phase difference is 180°. That is, the signal CK1 is an inverted signal of the signal CK2. In addition, a pulse width of the signal SP in FIG. 2 is a half pulse of the signal CK1 or the signal CK2.

First, at the time t1, the signal SP is set at high level, the signal CK1 is set at low level, and the signal CK2 is set at high level.

The potential of the node N1 becomes as follows. The transistor 105 is turned on because the signal CK2 is set at high level. The transistor 103 is turned off because the signal CK1 is set at low level. The transistor 104 is turned on because the potential of the node N2 is set to a high value as described later. Thus, the high-level signal SP is supplied to the node N1 through the transistor 105, so that the potential of the node N1 is increased. After that, at the timing when the potential of the node N1 is increased to a value obtained by subtracting the threshold voltage of the transistor 105 from the potential of the gate of the transistor 105, i.e., a value obtained by subtracting the threshold voltage of the transistor 105 from the high-level potential of the signal CK2 (VDD−Vth105), the transistor 105 is turned off The node N1 is set in a floating state and the potential of the node N1 is maintained at VDD−Vth105.

The potential of the node N2 becomes as follows. The transistor 106 is turned on because the signal CK2 is set at high level. Furthermore, the transistor 107 is turned on because the potential of the node N1 is set to a high value. Thus, the node N1 is supplied with the high-level signal CK2 through the transistor 106 and with the voltage VSS through the transistor 107. Accordingly, the potential of the node N2 is determined by resistance ratios of the transistor 106 and the transistor 107. Here, the source-drain resistance of the transistor 106 is sufficiently smaller than that of the transistor 107. In addition, the potential of the node N2 is sufficiently higher than VSS. Specifically, the potential of the node N2 is set to a value that is higher than the sum of the potential of the first terminal of the transistor 102 and the threshold voltage of the transistor 102 and is higher than the sum of the potential of the first terminal of the transistor 104 and the threshold voltage of the transistor 104, i.e., a value that is higher than the sum of the voltage VSS and the threshold voltage of the transistor 102 (VSS+Vth102) and is higher than the sum of the voltage VSS and the threshold voltage of the transistor 104 (VSS+Vth104).

The potential of the wiring 112 becomes as follows. The transistor 101 is turned on because the potential of the node N1 is set to a high value. Furthermore, the transistor 102 is turned on because the potential of the node N2 is set to a high value. Thus, the wiring 112 is supplied with the low-level signal CK1 through the transistor 101 and with the voltage VSS through the transistor 102, so that the potential of the wiring 112 is set to VSS. That is, the signal OUT is set at low level.

Next, at the time t2, the signal SP is set at low level, the signal CK1 is set at high level, and the signal CK2 is set at low level.

The potential of the node N1 becomes as follows. The transistor 105 remains off because the signal CK2 is set at low level. The transistor 103 is turned on because the signal CK1 is set at high level. The transistor 104 is turned off because the potential of the node N2 is set to VSS as described later. Thus, the node N1 remains in a floating state and the potential of the node N1 is maintained at VDD−Vth105. Note that as described later, as the potential of the wiring 112 is increased, the potential of the node N1 is further increased.

The potential of the node N2 becomes as follows. The transistor 106 is turned off because the signal CK2 is set at low level. The transistor 107 remains on because the potential of the node N1 is set to a high value. Thus, the node N2 is supplied with the voltage VSS through the transistor 107, so that the potential of the node N2 is set to VSS.

The potential of the wiring 112 becomes as follows. The transistor 101 remains on because the potential of the node N1 maintains a high value. The transistor 102 is turned off because the potential of the node N2 is set to VSS. Thus, the wiring 112 is supplied with the high-level signal CK1 through the transistor 101, so that the potential of the wiring 112 is increased. At this time, the potential difference between the node N1 and the wiring 112 is maintained by parasitic capacitance between the gate and the second terminal of the transistor 101. Furthermore, the node N1 is in a floating state. Accordingly, as the potential of the wiring 112 is increased, the potential of the node N1 is also increased. Here, the potential of the node N1 is set to a value that is higher than the sum of the potential of the first terminal of the transistor 101 and the threshold voltage of the transistor 101, that is, the sum of the high-level potential of the signal CK1 and the threshold voltage of the transistor 101 (VDD+Vth101). Thus, the potential of the wiring 112 is increased to VDD. That is, the signal OUT is set to high level.

Next, at the time t3, the signal SP remains low level, the signal CK1 is set at low level, and the signal CK2 is set at high level.

The potential of the node N1 becomes as follows. The transistor 105 is turned on because the signal CK2 is set at high level. The transistor 103 is turned off because the signal CK1 is set at low level. As described later, the potential of the node N2 is set to a high value, so that the transistor 104 is turned on. Thus, the node N1 is supplied with the low-level signal SP, so that the potential of the node N1 is set to VSS.

The potential of the node N2 becomes as follows. The transistor 106 is turned on because the signal CK2 is set at high level. The transistor 107 is turned off because the potential of the node N1 becomes VSS. Thus, the high-level signal CK2 is supplied to the node N2 through the transistor 106, so that the potential of the node N2 is increased. After that, at the timing when the potential of the node N2 is increased to a value obtained by subtracting the threshold voltage of the transistor 106 from the potential of the gate of the transistor 106, i.e., a value obtained by subtracting the threshold voltage of the transistor 106 from the high-level potential of the signal CK2 (VDD−Vth106), the transistor 106 is turned off. The node N2 is set in a floating state and the potential of the node N2 is maintained at VDD−Vth106.

The potential of the wiring 112 becomes as follows. The transistor 101 is turned off because the potential of the node N1 is set to VSS. Furthermore, the transistor 102 is turned on because the potential of the node N2 is set to a high value. Thus, the voltage VSS is supplied to the wiring 112 through the transistor 102, so that the potential of the wiring 112 is set to VSS. That is, the signal OUT is set at low level.

Next, at the time t4, the signal SP remains low level, the signal CK1 is set at high level, and the signal CK2 is set at low level.

The potential of the node N1 becomes as follows. The transistor 105 is turned off because the signal CK2 is set at low level. The transistor 103 is turned on because the signal CK1 is set at high level. The transistor 104 is turned on because the potential of the node N2 remains a high value as described later. Thus, the voltage VSS is supplied to the node N1 through the transistor 103 and the transistor 104, so that the potential of the node N1 remains VSS.

The potential of the node N2 becomes as follows. The transistor 106 is turned off because the signal CK2 is set at low level. The transistor 107 is turned off because the potential of the node N1 is set to VSS. Thus, the node N2 is set in a floating state and the potential of the node N2 is maintained at VDD−Vth106.

The potential of the wiring 112 becomes as follows. The transistor 101 remains off because the potential of the node N1 remains VSS. The transistor 102 remains on because the potential of the node N2 remains a high value. Thus, the voltage VSS continues to be supplied to the wiring 112 through the transistor 102, so that the potential of the wiring 112 remains VSS. That is, the signal OUT remains low level.

After the time t5, till the signal SP is set at high level again, the operation from the time t3 to the time t4 and the operation from the time t4 to the time t5 are repeated every time the signal CK1 and the signal CK2 are inverted.

Examples of an effect of the sequential circuit in FIG. 1 are described.

A novel circuit configuration can be provided.

The transistor 103 is turned off in the period T1, so that the gate of the transistor 102 can be connected to the gate of the transistor 104 and the transistor 102 can be turned on in the period T1, the period T3, and the period T4. Thus, a period during which the transistor 102 is on can be increased and a period during which the voltage VSS is supplied to the wiring 112 can also be increased. Furthermore, a transistor that is turned on alternately with the transistor 102 need not be provided, and thus the number of transistors can be reduced. Since on/off of the transistors 102 and 104 can be controlled by a common signal or a common circuit, the number of signals and the circuit size can be reduced.

When the transistor 104 is connected between the transistor 103 and the node N1, change in potential of the gate of the transistor 103 can be less likely to be transferred to the node N1. Thus, the potential of the node N1 can be stabilized, which can suppress a malfunction.

A circuit configuration capable of achieving the above effects can be provided.

Examples of the channel widths (W) and the channel lengths (L) of the transistors 101 to 107 are described.

The load of the wiring 112 is larger than that of the node N1 and that of the node N2 in many cases. Therefore, W/L of the transistor 101 is preferably higher than W/L of the transistor 103. Furthermore, W/L of the transistor 101 is preferably higher than W/L of the transistor 104. Furthermore, W/L of the transistor 101 is preferably higher than W/L of the transistor 105. Furthermore, W/L of the transistor 101 is preferably higher than W/L of the transistor 106. Furthermore, W/L of the transistor 101 is preferably higher than W/L of the transistor 107. Furthermore, W/L of the transistor 102 is preferably higher than W/L of the transistor 103. Furthermore, W/L of the transistor 102 is preferably higher than W/L of the transistor 104. Furthermore, W/L of the transistor 102 is preferably higher than W/L of the transistor 105. Furthermore, W/L of the transistor 102 is preferably higher than W/L of the transistor 106. Furthermore, W/L of the transistor 102 is preferably higher than W/L of the transistor 107. Since the current supply capability of the transistors 101 and 102 can be increased as described above, the change in the signal OUT can be made steep. Furthermore, the load of the wiring 112 can be increased. On the other hand, the size of the transistors 103 to 107 can be decreased, which enables reduction in the layout area of the sequential circuit.

The load of the node N1 is larger than that of the node N2 in many cases. Therefore, W/L of the transistor 105 is preferably higher than W/L of the transistor 106. Furthermore, W/L of the transistor 105 is preferably higher than W/L of the transistor 107. Since the current supply capability of the transistor 105 can be increased as described above, the potential of the node N1 can be changed rapidly; thus, the operation speed of the sequential circuit can be increased. In addition, the size of the transistors 106 and 107 can be decreased, which enables reduction in the layout area of the sequential circuit.

Whereas the transistor 105 is turned on to change the potential of the node N1, the transistors 103 and 104 are turned on to maintain the potential of the node N1. Therefore, W/L of the transistor 105 is preferably higher than W/L of the transistor 103. Furthermore, W/L of the transistor 105 is preferably higher than W/L of the transistor 104. Since the current supply capability of the transistor 105 can be increased as described above, the potential of the node N1 can be changed rapidly; thus, the operation speed of the sequential circuit can be increased. In addition, the size of the transistors 103 and 104 can be decreased, which enables reduction in the layout area of the sequential circuit.

The transistor 103 and the transistor 104 are connected in series between the wiring 113 and the node N1, and the transistor 107 is connected between the wiring 113 and the node N2. The load of the node N1 is larger than that of the node N2 in many cases. Therefore, W/L of the transistor 103 is preferably higher than W/L of the transistor 107. Furthermore, W/L of the transistor 104 is preferably higher than W/L of the transistor 107. Since the current supply capability of the transistors 103 and 104 can be increased as described above, the potential of the node N1 can be changed rapidly; thus, the operation speed of the sequential circuit can be increased. The potential of the node N1 can be surely maintained at VSS, which can suppress a malfunction. In addition, the size of the transistor 107 can be decreased, which enables reduction in the layout area of the sequential circuit.

As the area of the transistor 103 where the semiconductor layer and the gate electrode overlap with each other is smaller, the potential of the gate of the transistor 103 is less likely to be transmitted to the node N1. Note that when the area of the transistor 103 where the semiconductor layer and the gate electrode overlap with each other is small, the current supply capability of the transistor 103 might be decreased; thus, the current supply capability of the transistor 104 is preferably increased. Accordingly, the area of the transistor 104 where the semiconductor layer and the gate electrode overlap with each other is preferably larger than the area of the transistor 103 where the semiconductor layer and the gate electrode overlap with each other. Alternatively, W/L of the transistor 104 is preferably higher than W/L of the transistor 103. Alternatively, W×L of the transistor 104 is preferably higher than W×L of the transistor 103.

W/L of the transistor 106 is preferably higher than W/L of the transistor 107 so that the source-drain resistance of the transistor 106 is sufficiently lower than that of the transistor 107.

A modification example of the sequential circuit in FIG. 1 is described. Note that components in common with those in FIG. 1 are denoted by the same reference numerals or are not illustrated, and description thereof is omitted.

Figure 5A:
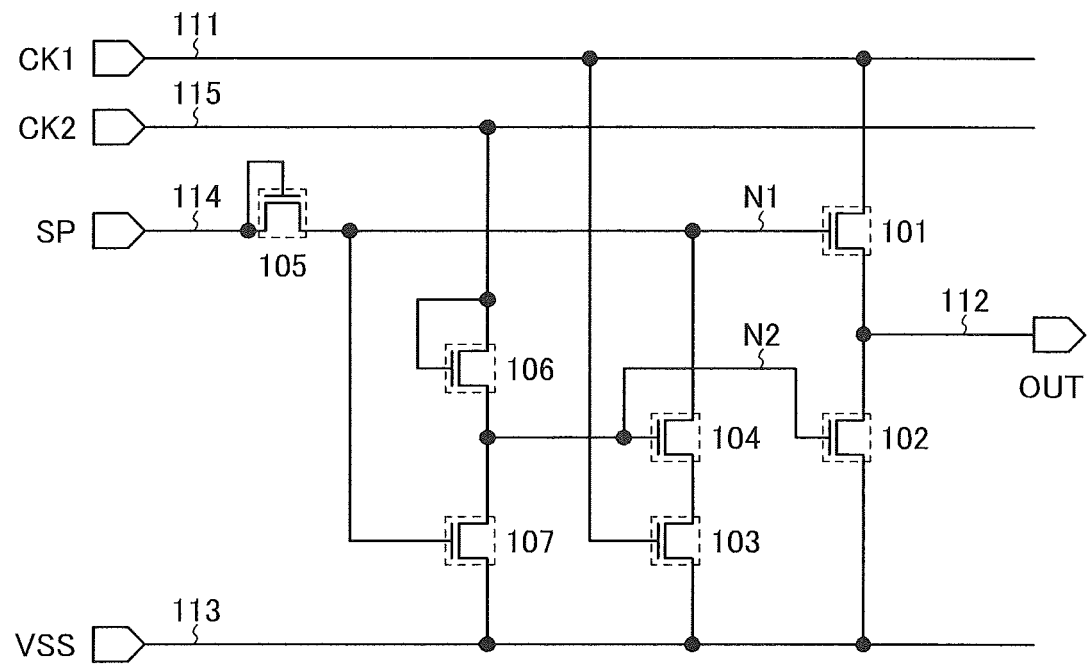
FIGS. 5A to 5D each are a circuit diagram of a sequential circuit.

As shown in FIG. 5A, the gate of the transistor 105 may be connected to the wiring 114. The transistor 105 in FIG. 5A supplies the signal SP to the node N1 on the basis of the signal SP. Thus, a malfunction due to a difference in timing of the signal SP and the signal CK2 can be prevented.

Figure 5B:
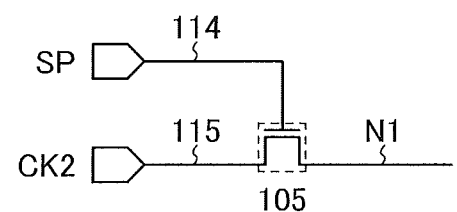

As shown in FIG. 5B, the first terminal of the transistor 105 may be connected to the wiring 115 and the gate of the transistor 105 may be connected to the wiring 114. The transistor 105 in FIG. 5B supplies the signal CK2 to the node N1 on the basis of the signal SP. Since the potential of the node N1 can be changed rapidly, the operation speed of the sequential circuit can be increased.

Figure 5C:
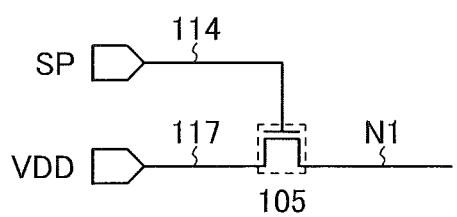

As shown in FIG. 5C, the first terminal of the transistor 105 may be connected to a wiring 117 and the gate of the transistor 105 may be connected to the wiring 114. The wiring 117 is supplied with the voltage VDD. The transistor 105 in FIG. 5C supplies the voltage VDD to the node N1 on the basis of the signal SP. Since the potential of the node N1 can be changed rapidly, the operation speed of the sequential circuit can be increased.

Figure 5D:
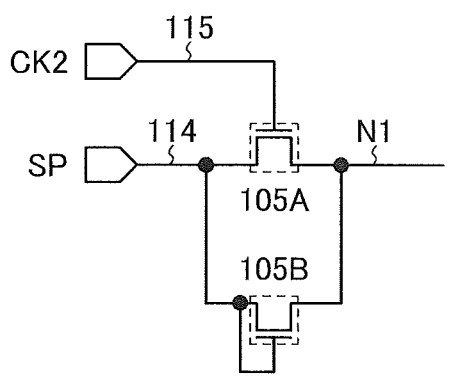

Two or more of the transistors 105 in FIG. 1 and FIGS. 5A to 5C may be provided in the sequential circuit. For example, as shown in FIG. 5D, a transistor 105A corresponding to the transistor 105 in FIG. 5A, and a transistor 105B corresponding to the transistor 105 in FIG. 1 may be provided.

Figure 6A:
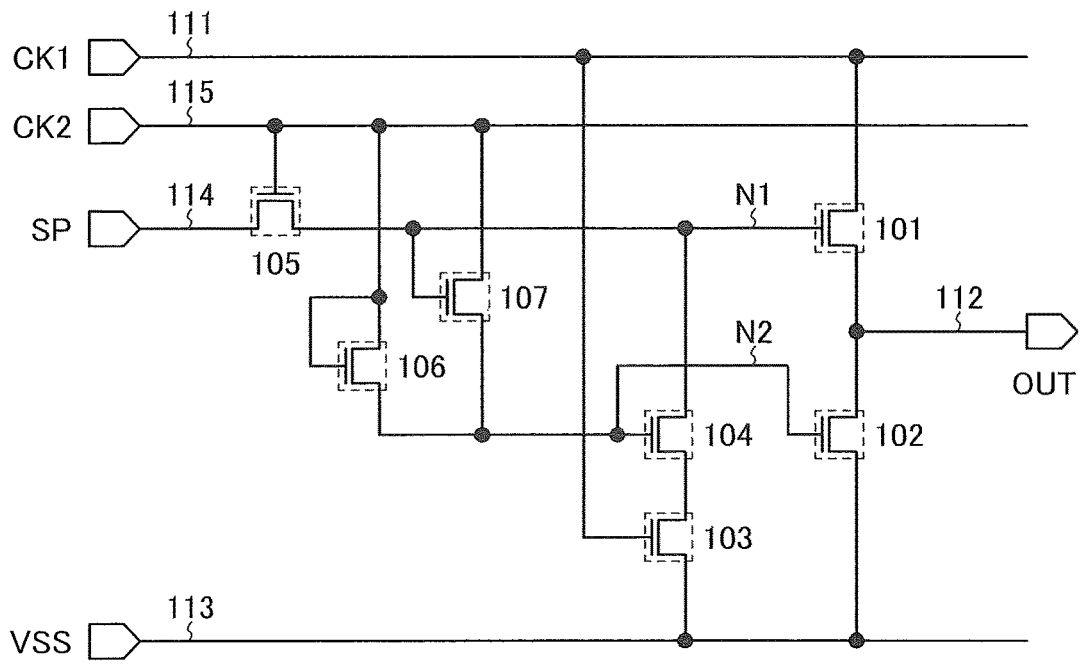
FIGS. 6A to 6E each are a circuit diagram of a sequential circuit.

As shown in FIG. 6A, the first terminal of the transistor 107 may be connected to the wiring 115. The transistor 107 in FIG. 6A supplies the signal CK2 to the node N2 on the basis of the potential of the node N1. Since the signal CK2 is set at high level in the period T1, a flow-through current generated in the transistor 106 and the transistor 107 in the period T1 can be prevented. Thus, power consumption can be reduced. Since W/L of the transistor 106 need not be increased, the layout area of the sequential circuit can be reduced.

Figure 6B:
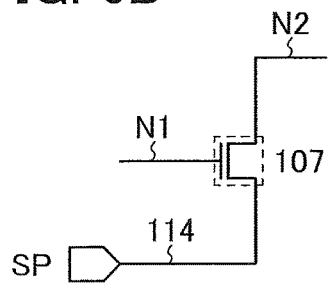

As shown in FIG. 6B, the first terminal of the transistor 107 may be connected to the wiring 114. The transistor 107 in FIG. 6B supplies the signal SP to the node N2 on the basis of the potential of the node N1. Since the signal SP is set at high level in the period T1, a flow-through current generated in the transistor 106 and the transistor 107 in the period T1 can be prevented. Thus, power consumption can be reduced. Since W/L of the transistor 106 need not be increased, the layout area of the sequential circuit can be reduced.

Figure 6C:
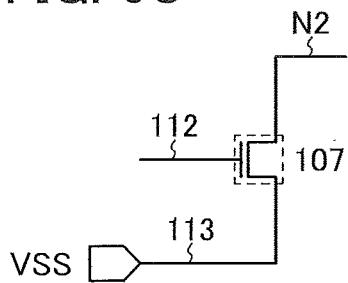

As shown in FIG. 6C, the gate of the transistor 107 may be connected to the wiring 112. The transistor 107 in FIG. 6C supplies the voltage VSS to the node N2 on the basis of the signal OUT. Since the signal OUT is set at low level in the period T1, the transistor 107 can be turned off in the period T1. Since a flow-through current generated in the transistor 106 and the transistor 107 in the period T1 can be prevented, power consumption can be reduced. Furthermore, since W/L of the transistor 106 need not be increased, the layout area of the sequential circuit can be reduced.

Figure 6D:
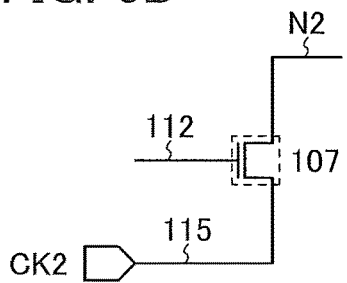

As shown in FIG. 6D, the first terminal of the transistor 107 may be connected to the wiring 115 and the gate of the transistor 107 may be connected to the wiring 112. The transistor 107 in FIG. 6D supplies the signal CK2 to the node N2 on the basis of the signal OUT. Since the signal OUT is set at low level in the period T1, the transistor 107 can be turned off in the period T1. Since a flow-through current generated in the transistor 106 and the transistor 107 in the period T1 can be prevented, power consumption can be reduced. Furthermore, since W/L of the transistor 106 need not be increased, the layout area of the sequential circuit can be reduced.

Figure 6E:
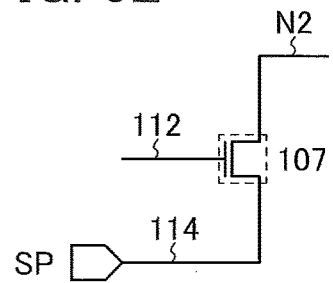

As shown in FIG. 6E, the first terminal of the transistor 107 may be connected to the wiring 114 and the gate of the transistor 107 may be connected to the wiring 112. The transistor 107 in FIG. 6E supplies the signal SP to the node N2 on the basis of the signal OUT. Since the signal OUT is set at low level in the period T1, the transistor 107 can be turned off in the period T1. Since a flow-through current generated in the transistor 106 and the transistor 107 in the period T1 can be prevented, power consumption can be reduced. Furthermore, since W/L of the transistor 106 need not be increased, the layout area of the sequential circuit can be reduced.

Figure 7A:
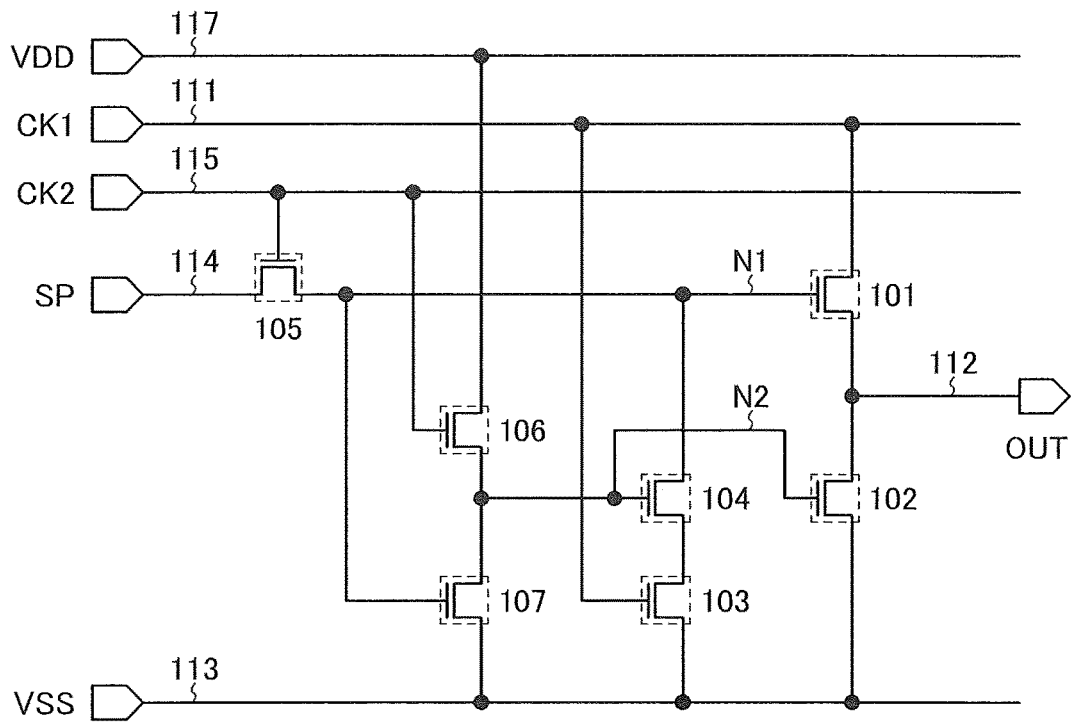
FIGS. 7A to 7C each are a circuit diagram of a sequential circuit.

As shown in FIG. 7A, the first terminal of the transistor 106 may be connected to the wiring 117. The transistor 106 in FIG. 7A supplies the voltage VDD to the node N2 on the basis of the signal CK2. Thus, it is possible to prevent supplying the low-level signal to the node N2 owing to a difference in timing.

Figure 7B:
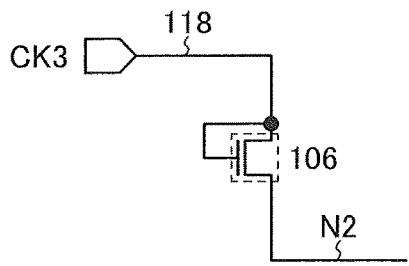

As shown in FIG. 7B, the first terminal of the transistor 106 may be connected to a wiring 118 and the gate of the transistor 106 may be connected to the wiring 118. The signal CK3 is input to the wiring 118. The signal CK3 may be a clock signal. Note that the signal CK3 has a phase different from those of the signal CK1 and the signal CK2. The transistor 106 in FIG. 7B supplies the signal CK3 to the node N2 on the basis of the signal CK3.

Figure 7C:
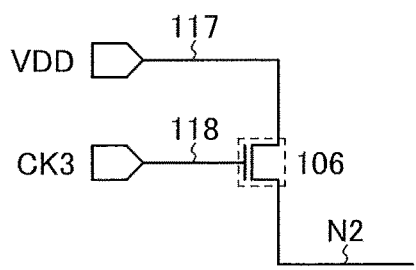
Figure 8A:
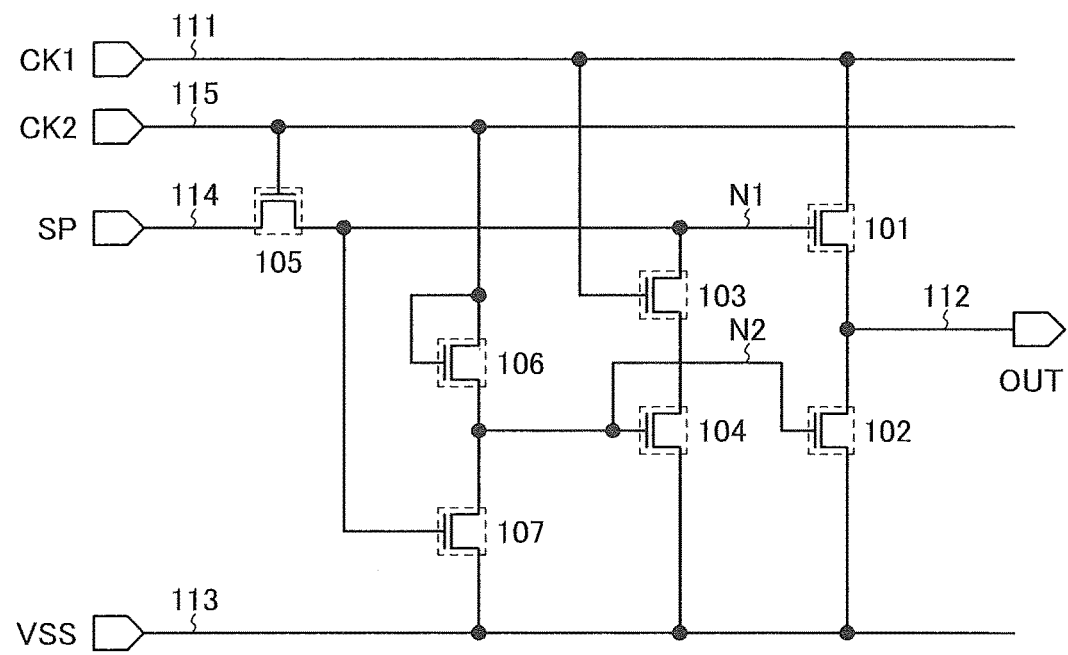
FIGS. 8A and 8B each are a circuit diagram of a sequential circuit.

As shown in FIG. 7C, the first terminal of the transistor 106 may be connected to the wiring 117 and the gate of the transistor 107 may be connected to the wiring 118. The transistor 106 in FIG. 7C supplies the voltage VDD to the node N2 on the basis of the signal CK3. Thus, it is possible to prevent supplying the low-level signal to the node N2 owing to a difference in timing As shown in FIG. 8A, the first terminal of the transistor 104 may be connected to the wiring 113, the first terminal of the transistor 103 may be connected to the second terminal of the transistor 104, and the second terminal of the transistor 103 may be connected to the node N1.

Figure 8B:
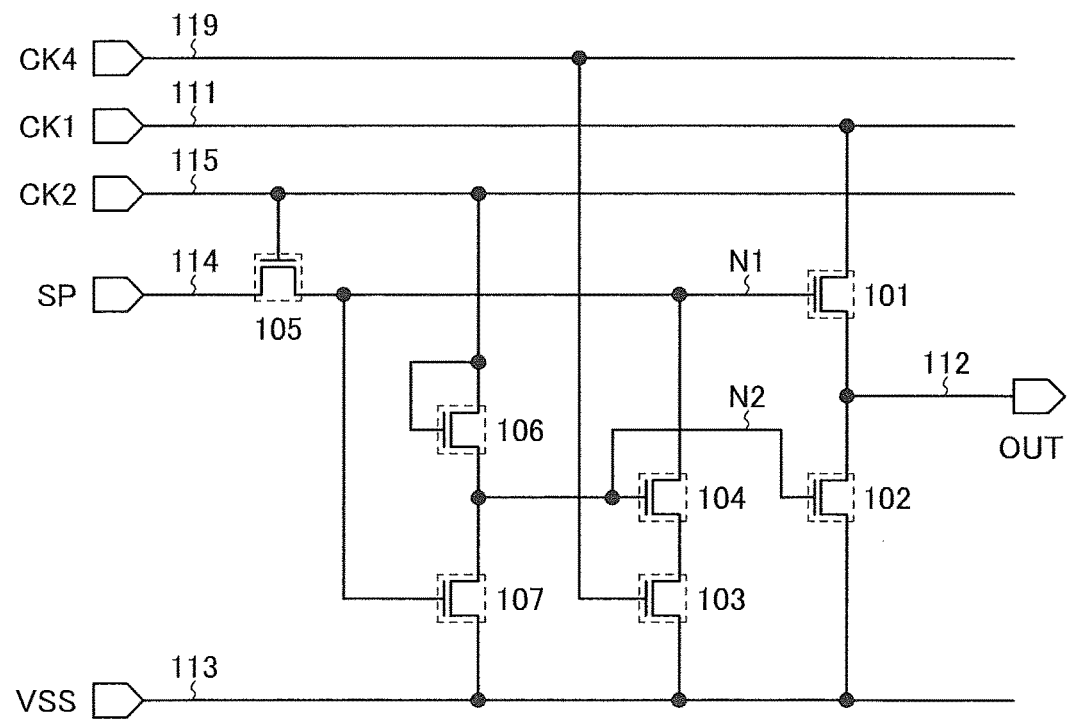

As shown in FIG. 8B, the gate of the transistor 103 may be connected to a wiring 119. The signal CK4 is input to the wiring 119, and supplied to the gate of the transistor 103 through the wiring 119. The signal CK4 may be a clock signal. Note that the signal CK4 has a phase different from those of the signal CK1 and the signal CK2.

Although not shown, the gate of the transistor 103 may be connected to the wiring 118.

Although not shown, a capacitor whose first terminal is connected to the node N1 and second terminal is connected to the wiring 112 may be provided.

Although not shown, the first terminal of the transistor 102 may be connected to a wiring different from the wiring 113. For example, by supplying a voltage higher than the voltage VSS to the wiring, current generated in the transistor 101 and the transistor 102 can be small Although not shown, the gate of the transistor 102 may be connected to the wiring 115, the wiring 118, or the wiring 119.

Figure 9A:
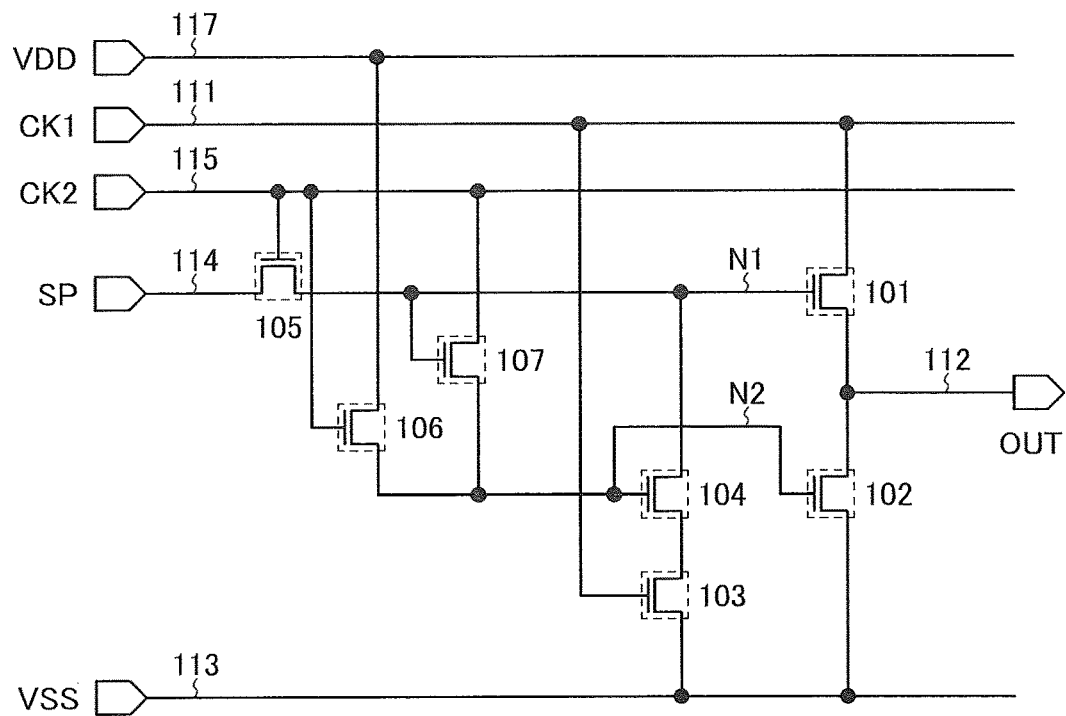
FIGS. 9A and 9B each are a circuit diagram of a sequential circuit.
Figure 9B:
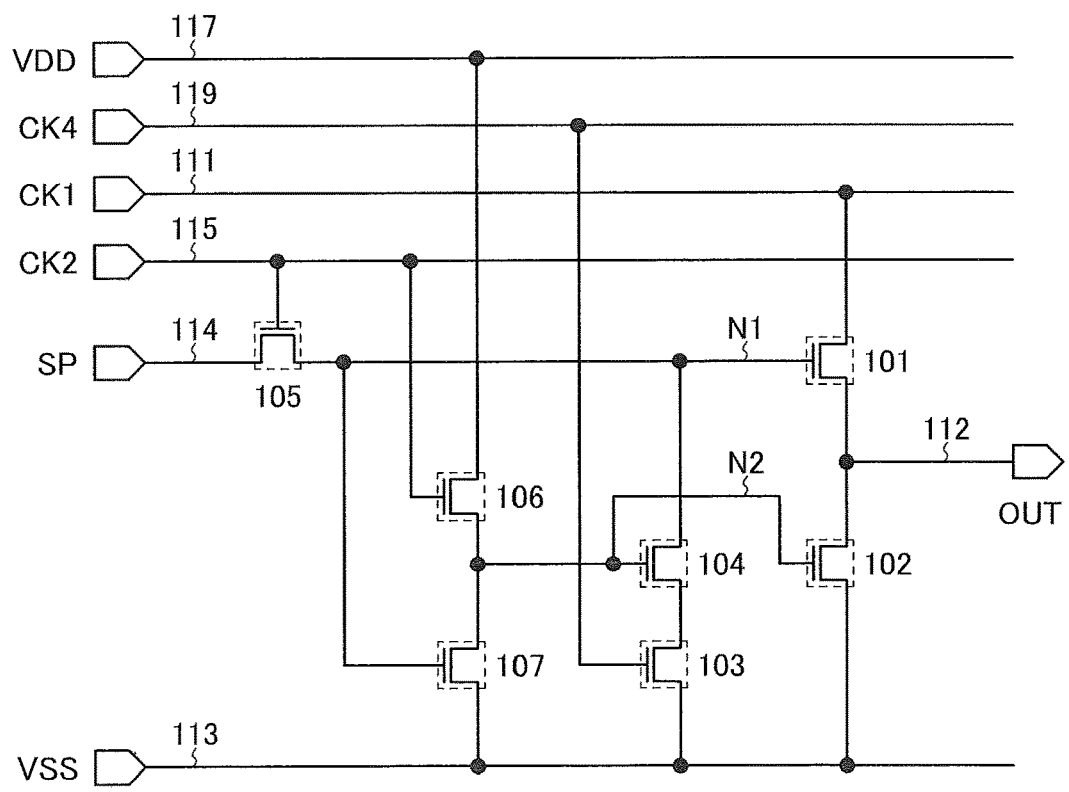

Note that the above-described sequential circuits in FIG. 1, FIGS. 5A to 5D, FIGS. 6A to 6E, FIGS. 7A to 7C, FIGS. 8A and 8B, and the like may be freely combined. For example, the first terminal of the transistor 106 may be connected to the wiring 117 as shown in FIG. 7A and the first terminal of the transistor 107 may be connected to the wiring 115 as shown in FIG. 6A (see FIG. 9A). Alternatively, the first terminal of the transistor 106 may be connected to the wiring 117 as shown in FIG. 7A and the gate of the transistor 103 may be connected to the wiring 119 as shown in FIG. 8B (see FIG. 9B).

One embodiment of the present invention includes the following configurations in its category.

Figure 10A:
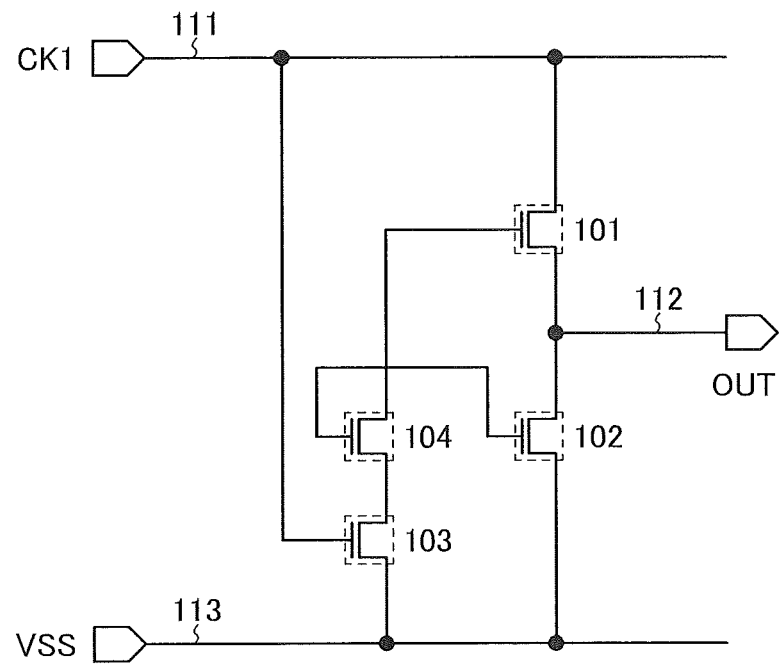
FIGS. 10A and 10B each are a circuit diagram of a sequential circuit.

According to one embodiment of the present invention, the transistors 101 to 104 are provided. The first terminal and the second terminal of the transistor 101 are connected to the wiring 111 and the wiring 112, respectively. The first terminal and the second terminal of the transistor 102 are connected to the wiring 113 and the wiring 112, respectively. The first terminal and the gate of the transistor 103 are connected to the wiring 113 and the wiring 111, respectively. The first terminal, the second terminal, and the gate of the transistor 104 are connected to the second terminal of the transistor 103, the gate of the transistor 101, and the gate of the transistor 102, respectively (see FIG. 10A).

Figure 10B:
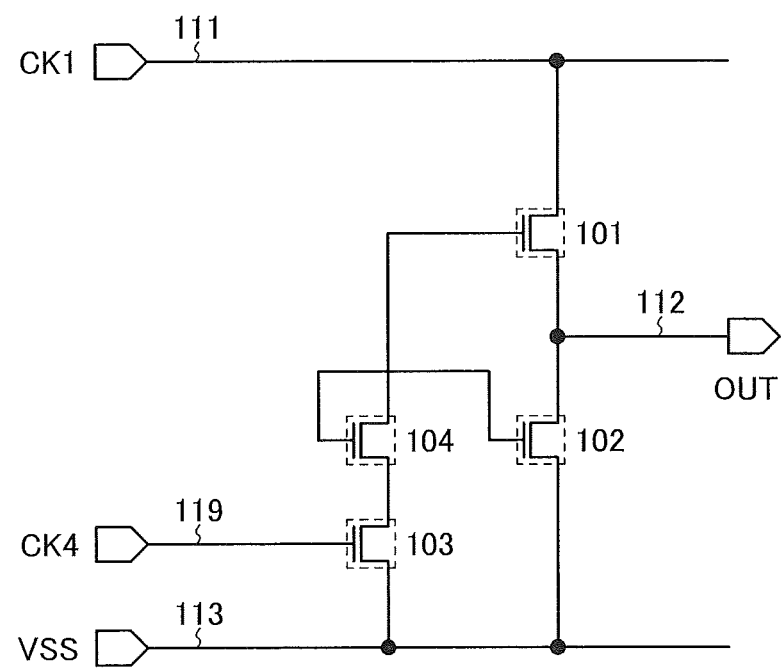

According to one embodiment of the present invention, the transistors 101 to 104 are provided. The first terminal and the second terminal of the transistor 101 are connected to the wiring 111 and the wiring 112, respectively. The first terminal and the second terminal of the transistor 102 are connected to the wiring 113 and the wiring 112, respectively. The first terminal and the gate of the transistor 103 are connected to the wiring 113 and the wiring 119, respectively. The first terminal, the second terminal, and the gate of the transistor 104 are connected to the second terminal of the transistor 103, the gate of the transistor 101, and the gate of the transistor 102, respectively (see FIG. 10B).

This embodiment can be implemented in appropriate combination with any of the structures described in the other embodiments and the like in this specification and the like.

(Embodiment 2)

In this embodiment, a shift register (also referred to as a semiconductor device) using the sequential circuit in Embodiment 1 is described.

Figure 11:
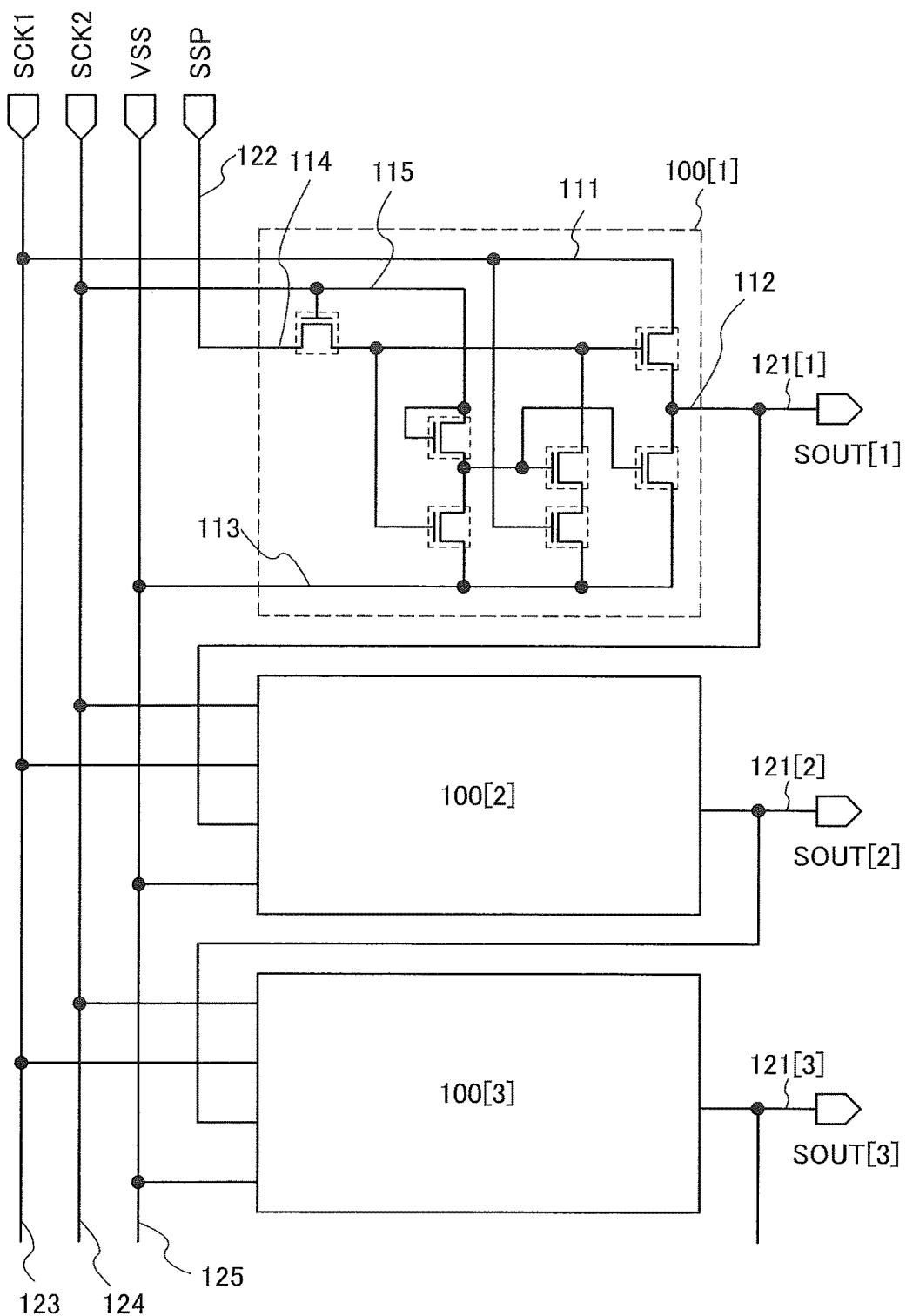
FIG. 11 is a circuit diagram of a shift register.

An example of a configuration of the shift register is described with reference to FIG. 11. FIG. 11 is an example of a circuit diagram of the shift register.

The shift register in FIG. 11 includes sequential circuits 100[1] to 100[N] (N is a natural number of 2 or more). Note that only the sequential circuits 100[1] to 100[3] are shown in FIG. 11. As the sequential circuits 100[1] to 100[N], the sequential circuit in FIG. 1 is used. The sequential circuits 100[1] to 100[N] are not limited to the sequential circuit in FIG. 11, and a sequential circuit described in Embodiment 1 or the like in this specification or the like may be used.

The shift register in FIG. 11 is connected to wirings 121[1] to 121[N], a wiring 122, a wiring 123, a wiring 124, and a wiring 125. In the sequential circuit 100[i] (i is one of 2 to N), the wiring 111 is connected to one of the wiring 123 and the wiring 124, the wiring 112 is connected to the wiring 121[i], the wiring 113 is connected to the wiring 125, the wiring 114 is connected to the wiring 121[i-1], and the wiring 115 is connected to the other of the wiring 123 and the wiring 124. The sequential circuit 100[1] is different from the sequential circuit 100[i] in that the wiring 114 is connected to the wiring 122. Furthermore, in the sequential circuit of the odd-numbered stage and the sequential circuit of the even-numbered stage, a portion to which the wiring 111 is connected and a portion to which the wiring 115 is connected are opposite. For example, in the case where the wiring 111 and the wiring 123 are connected to each other and the wiring 115 and the wiring 124 are connected to each other in the odd-numbered stage, the wiring 111 and the wiring 124 are connected to each other and the wiring 115 and the wiring 123 are connected to each other in the even-numbered stage.

Signals SOUT[1] to SOUT[N] are output from the wirings 121[1] to 121[N], respectively. The wirings 121[1] to 121[N] each correspond to the wiring 112 and the signals SOUT[1] to SOUT[N] each correspond to the signal OUT. The signal SSP is input to the wiring 122. The wiring 122 corresponds to the wiring 114, and the signal SSP corresponds to the signal SP. In particular, in the sequential circuit 100[i], the wiring [i-1] corresponds to the wiring 114 and the signal SOUT[i-1] corresponds to the signal SP. The signal SCK1 is input to the wiring 123, and the signal SCK2 is input to the wiring 124. The wiring 123 corresponds to one of the wiring 111 and the wiring 115, and the signal SCK1 corresponds to one of the signal CK1 and the signal CK2. The wiring 124 corresponds to the other of the wiring 111 and the wiring 115, and the signal SCK2 corresponds to the other of the signal CK1 and the signal CK2. The voltage VSS is supplied to the wiring 125. The wiring 125 corresponds to the wiring 113.

Figure 12:
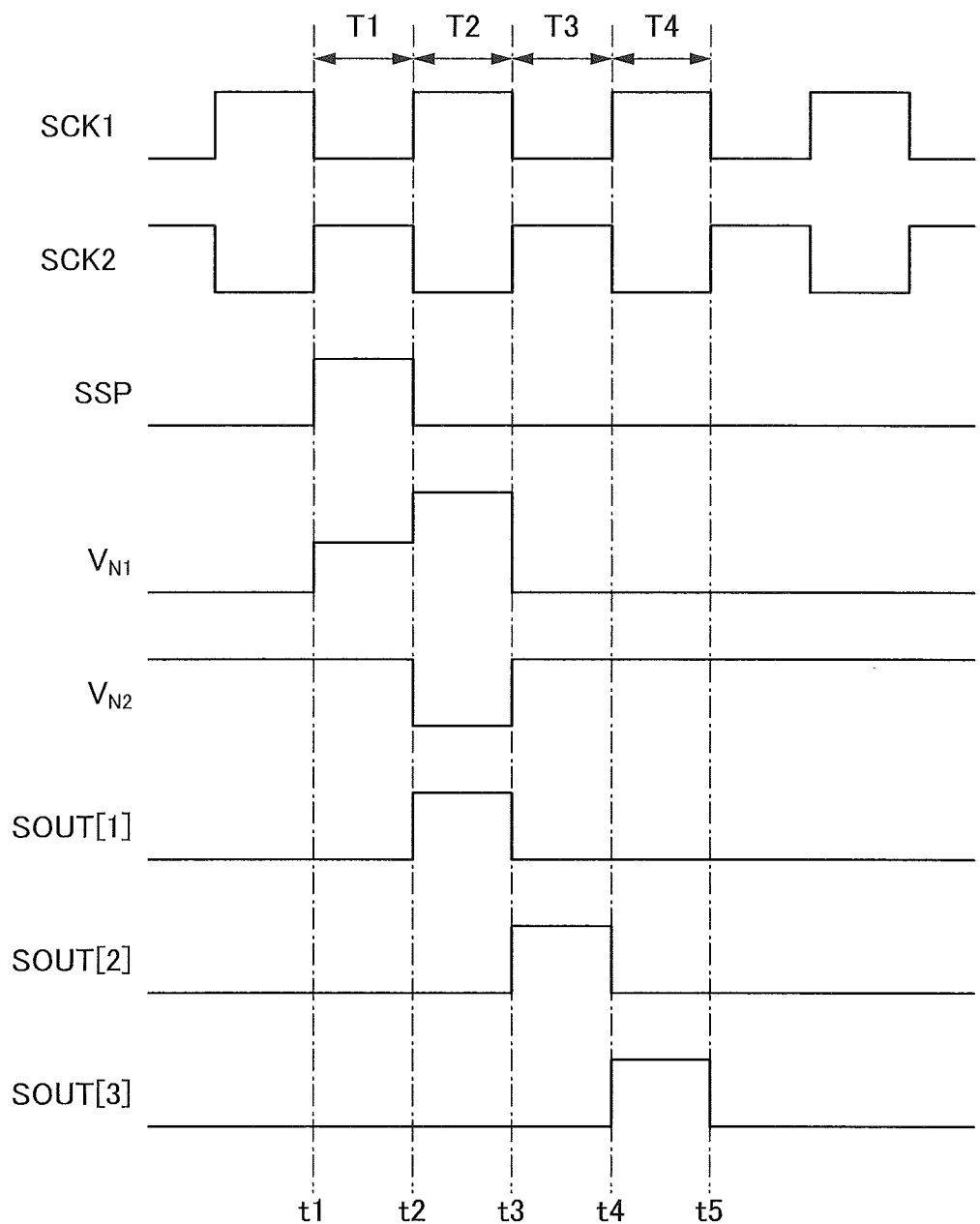
FIG. 12 is a timing chart of a shift register.

An operation example of the shift register in FIG. 11 is described with reference to FIG. 12. FIG. 12 is a timing chart showing examples of the signal SCK1, the signal SCK2, the signal SSP, the potential of the node N1 of the sequential circuit 100[1] ($V_{N1}$), the potential of the node N2 of the sequential circuit 100[1] ($V_{N2}$), the signal SOUT[1], the signal SOUT[2], and the signal SOUT[3].

First, at the time t1, the signal SCK1 is set at low level, the signal SCK2 is set at high level, and the signal SSP is set at high level. The sequential circuit 100[1] performs the operation in the period T1 described in Embodiment 1 so that the signal SOUT[1] is set at low level. The sequential circuit 100[2] performs the operation in the period T4 described in Embodiment 1 so that the signal SOUT[2] is set at low level. The sequential circuit 100[3] performs the operation in the period T3 described in Embodiment 1 so that the signal SOUT[3] is set at low level.

Next, at the time t2, the signal SCK1 is set at high level, the signal SCK2 is set at low level, and the signal SSP is set at low level. The sequential circuit 100[1] performs the operation in the period T2 described in Embodiment 1 so that the signal SOUT[1] is set at high level. The sequential circuit 100[2] performs the operation in the period T1 described in Embodiment 1 so that the signal SOUT[2] is set at low level. The sequential circuit 100[3] performs the operation in the period T4 described in Embodiment 1 so that the signal SOUT[3] is set at low level.

Next, at the time t3, the signal SCK1 is set at low level, the signal SCK2 is set at high level, and the signal SSP is set at low level. The sequential circuit 100[1] performs the operation in the period T3 described in Embodiment 1 so that the signal SOUT[1] is set at low level. The sequential circuit 100[2] performs the operation in the period T2 described in Embodiment 1 so that the signal SOUT[2] is set at high level. The sequential circuit 100[3] performs the operation in the period T1 described in Embodiment 1 so that the signal SOUT[3] is set at low level.

Next, at the time t4, the signal SCK1 is set at high level, the signal SCK2 is set at low level, and the signal SSP is set at low level. The sequential circuit 100[1] performs the operation in the period T4 described in Embodiment 1 so that the signal SOUT[1] is set at low level. The sequential circuit 100[2] performs the operation in the period T3 described in Embodiment 1 so that the signal SOUT[2] is set at low level. The sequential circuit 100[3] performs the operation in the period T2 described in Embodiment 1 so that the signal SOUT[3] is set at high level.

This embodiment can be implemented in appropriate combination with any of the structures described in the other embodiments and the like in this specification and the like.

(Embodiment 3)

<Structure Example of Semiconductor Display Device>

Next, a structure example of a semiconductor display device of one embodiment of the present invention is described.

Figure 13A:
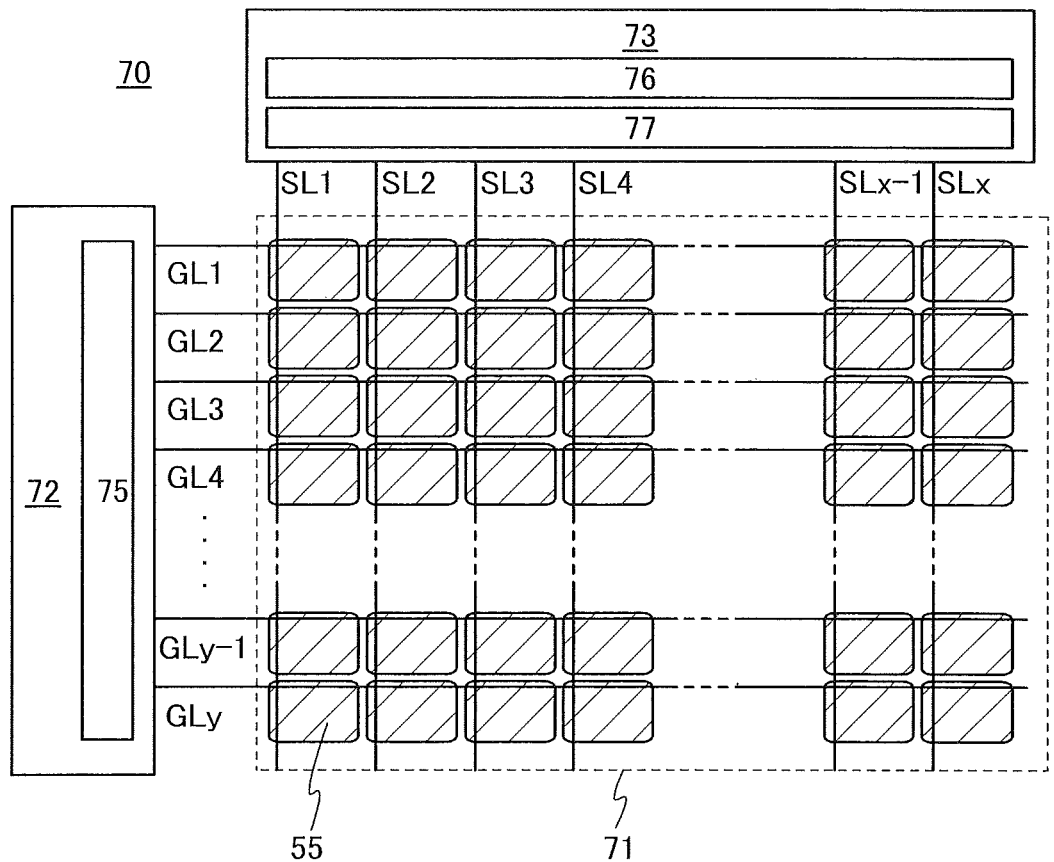
FIGS. 13A to 13C illustrate configurations of semiconductor display devices.

In a semiconductor display device 70 illustrated in FIG. 13A, a pixel portion 71 includes a plurality of pixels 55, wirings GL (wirings GL1 to GLy, y: a natural number) that correspond to bus lines each selecting the pixels 55 in a row, and wirings SL (wirings SL1 to SLx, x: a natural number) for supplying video signals to the selected pixels 55. The input of signals to the wirings GL is controlled by a driver circuit 72. The input of video signals to the wirings SL is controlled by a driver circuit 73. Each of the plurality of pixels 55 is connected to at least one of the wirings GL and at least one of the wirings SL.

Specifically, the driver circuit 72 includes a shift register 75 that produces signals for sequentially selecting the wirings GL1 to GLy. Moreover, specifically, the driver circuit 73 includes a shift register 76 that sequentially produces signals having pulses and a switching circuit 77 that controls supply of video signals to the wirings SL1 to SLx in accordance with the signals produced in the shift register 76.

The sequential circuit or the shift register of one embodiment of the present invention can be used as the shift register 75 or the shift register 76. In this case, the wirings GL1 to GLy each correspond to the wiring 112, for example.

Note that the kinds and number of the wirings in the pixel portion 71 can be determined by the configuration, number, and position of the pixels 55. Specifically, in the pixel portion 71 illustrated in FIG. 13A, the pixels 55 are arranged in a matrix of x columns and y rows, and the wirings SL1 to SLx and the wirings GL1 to GLy are provided in the pixel portion 71 as an example.

Although FIG. 13A illustrates the case where the driver circuits 72 and 73 and the pixel portion 71 are formed over one substrate as an example, the driver circuits 72 and 73 may be formed over a substrate different from a substrate over which the pixel portion 71 is formed.

Figure 13B:
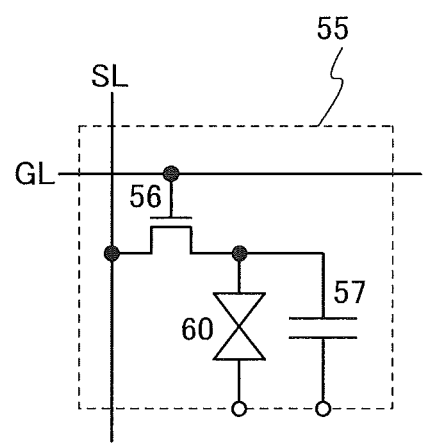

FIG. 13B illustrates an example of a configuration of the pixel 55. Each of the pixels 55 includes a liquid crystal element 60, a transistor 56 that controls the supply of an video signal to the liquid crystal element 60, and a capacitor 57 that holds voltage between a pixel electrode and a common electrode of the liquid crystal element 60. The liquid crystal element 60 includes the pixel electrode, the common electrode, and a liquid crystal layer containing a liquid crystal material to which voltage between the pixel electrode and the common electrode is applied.

The transistor 56 controls whether to supply the potential of the wiring SL to the pixel electrode of the liquid crystal element 60. A predetermined potential is supplied to the common electrode of the liquid crystal element 60.

The connection state between the transistor 56 and the liquid crystal element 60 is specifically described below. In FIG. 13B, a gate of the transistor 56 is connected to any one of the wirings GL1 to GLy. One of a source and a drain of the transistor 56 is connected to any one of the wirings SL1 to SLx, and the other of the source and the drain of the transistor 56 is connected to the pixel electrode of the liquid crystal element 60.

The transmittance of the liquid crystal element 60 changes when the alignment of liquid crystal molecules included in the liquid crystal layer changes in accordance with the level of voltage applied between the pixel electrode and the common electrode. Accordingly, when the transmittance of the liquid crystal element 60 is controlled by the potential of a video signal supplied to the pixel electrode, gray-scale images can be displayed. In each of the plurality of pixels 55 included in the pixel portion 71, the gray level of the liquid crystal element 60 is adjusted in response to a video signal containing image data; thus, an image is displayed on the pixel portion 71.

FIG. 13B illustrates an example in which the one transistor 56 is used as a switch for controlling the input of a video signal to the pixel 55. However, a plurality of transistors functioning as one switch may be used in the pixel 55.

In one embodiment of the present invention, the transistor 56 with an extremely low off-state current is preferably used as the switch for controlling the input of a video signal to the pixel 55. With the transistor 56 having an extremely low off-state current, leakage of charge through the transistor 56 can be prevented. Thus, the potential of a video signal that is supplied to the liquid crystal element 60 and the capacitor 57 can be held more reliably. Accordingly, changes in transmittance of the liquid crystal element 60 due to leakage of charge in one frame period are prevented, so that the quality of an image to be displayed can be improved. Since leakage of charge through the transistor 56 can be prevented when the transistor 56 has a low off-state current, the supply of a power supply potential or a signal to the driver circuits 72 and 73 may be stopped in a period during which a still image is displayed. With the above configuration, the number of times of writing video signals to the pixel portion 71 can be reduced, and thus power consumption of the semiconductor display device can be reduced.

For example, the off-state current of a transistor including a semiconductor film containing an oxide semiconductor is extremely low, and therefore is suitable for the transistor 56, for example.

In addition, the transistor 56 in FIG. 13B may include a pair of gate electrodes overlapping with each other with a semiconductor film provided therebetween. The pair of gate electrodes are electrically connected to each other. In one embodiment of the present invention, the above structure allows the on-state current and the reliability of the transistor 56 to be increased.

Figure 13C:
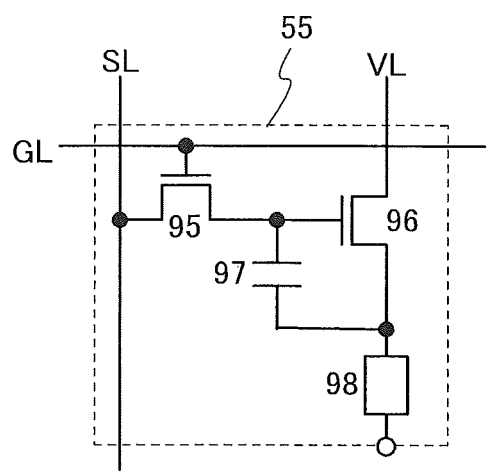

Next, FIG. 13C illustrates another example of the pixel 55. The pixel 55 includes a transistor 95 for controlling input of a video signal to the pixel 55, a light-emitting element 98, a transistor 96 for controlling the value of current supplied to the light-emitting element 98 in response to a video signal, and a capacitor 97 for holding the potential of a video signal.

Examples of the light-emitting element 98 include an element whose luminance is controlled by current or voltage, such as a light-emitting diode (LED) or an organic light-emitting diode (OLED). For example, an OLED includes at least an EL layer, an anode, and a cathode. The EL, layer is formed using a single layer or a plurality of layers between the anode and the cathode, at least one of which is a light-emitting layer containing a light-emitting substance.

From the EL layer, electroluminescence is obtained by current supplied when a potential difference between the cathode and the anode is higher than or equal to the threshold voltage of the light-emitting element 98. As electroluminescence, there are luminescence (fluorescence) at the time of returning from a singlet-excited state to a ground state and luminescence (phosphorescence) at the time of returning from a triplet-excited state to a ground state.

The potential of one of the anode and the cathode of the light-emitting element 98 is controlled in response to an video signal input to the pixel 55. The one of the anode and the cathode whose potential is controlled in response to a video signal is used as a pixel electrode, and the other is used as a common electrode. A predetermined potential is supplied to the common electrode of the light-emitting element 98, and the luminance of the light-emitting element 98 is determined by a potential difference between the pixel electrode and the common electrode. Thus, the luminance of the light-emitting element 98 is controlled by the potential of the video signal, so that the light-emitting element 98 can express gray level. In each of the plurality of pixels 55 included in the pixel portion, the gray level of the light-emitting element 98 is adjusted in response to a video signal containing image data; thus, an image is displayed on the pixel portion 71.

Next, connection between the transistor 95, the transistor 96, the capacitor 97, and the light-emitting element 98 that are included in the pixel 55 is described.

One of a source and a drain of the transistor 95 is connected to the wiring SL, and the other is connected to a gate of the transistor 96. A gate of the transistor 95 is connected to the wiring GL. One of a source and a drain of the transistor 96 is connected to a power supply line VL, and the other is connected to the light-emitting element 98. Specifically, the other of the source and the drain of the transistor 96 is connected to one of the anode and the cathode of the light-emitting element 98. A predetermined potential is supplied to the other of the anode and the cathode of the light-emitting element 98.

FIG. 13C illustrates the case where the transistor 96 includes a pair of gate electrodes overlapping with each other with a semiconductor film provided therebetween. The pair of gate electrodes are electrically connected to each other. In one embodiment of the present invention, the above structure allows the on-state current and the reliability of the transistor 96 to be increased.

For example, in this specification and the like, a display element, a display device which is a device including a display element, a light-emitting element, and a light-emitting device which is a device including a light-emitting element can employ a variety of modes or can include a variety of elements. A display element, a display device, a light-emitting element, or a light-emitting device includes at least one of the following, for example: an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element using a carbon nanotube. In addition to the above, a display medium whose contrast, luminance, reflectivity, transmittance, or the like changes by electromagnetic action may be included. Note that examples of display devices including EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or electrophoretic elements include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Accordingly, power consumption can be further reduced.

For example, in this specification and the like, a transistor can be formed using any of a variety of substrates. The type of a substrate is not limited to a certain type. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of a glass substrate include a barium borosilicate glass substrate, an aluminoborosilicate glass substrate, and a soda lime glass substrate. Examples of a flexible substrate, an attachment film, a base film, or the like are as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper. Specifically, when a transistor is formed using a semiconductor substrate, a single crystal substrate, an SOI substrate, or the like, a transistor with few variations in characteristics, size, shape, or the like, high current supply capability, and a small size can be formed. By forming a circuit using such a transistor, power consumption of the circuit can be reduced or the circuit can be highly integrated.

Alternatively, a flexible substrate may be used as the substrate, and the transistor may be provided directly on the flexible substrate. Further alternatively, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, a transistor may be formed using one substrate, and then transferred to another substrate. Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. With the use of such a substrate, a transistor with excellent properties, a transistor with low power consumption, or a device with high durability can be formed, high heat resistance can be provided, or a reduction in weight or thinning can be achieved.

This embodiment can be implemented in appropriate combination with any of the structures described in the other embodiments and the like in this specification and the like.

(Embodiment 4)

<Configuration of Pixel>

Figure 14:
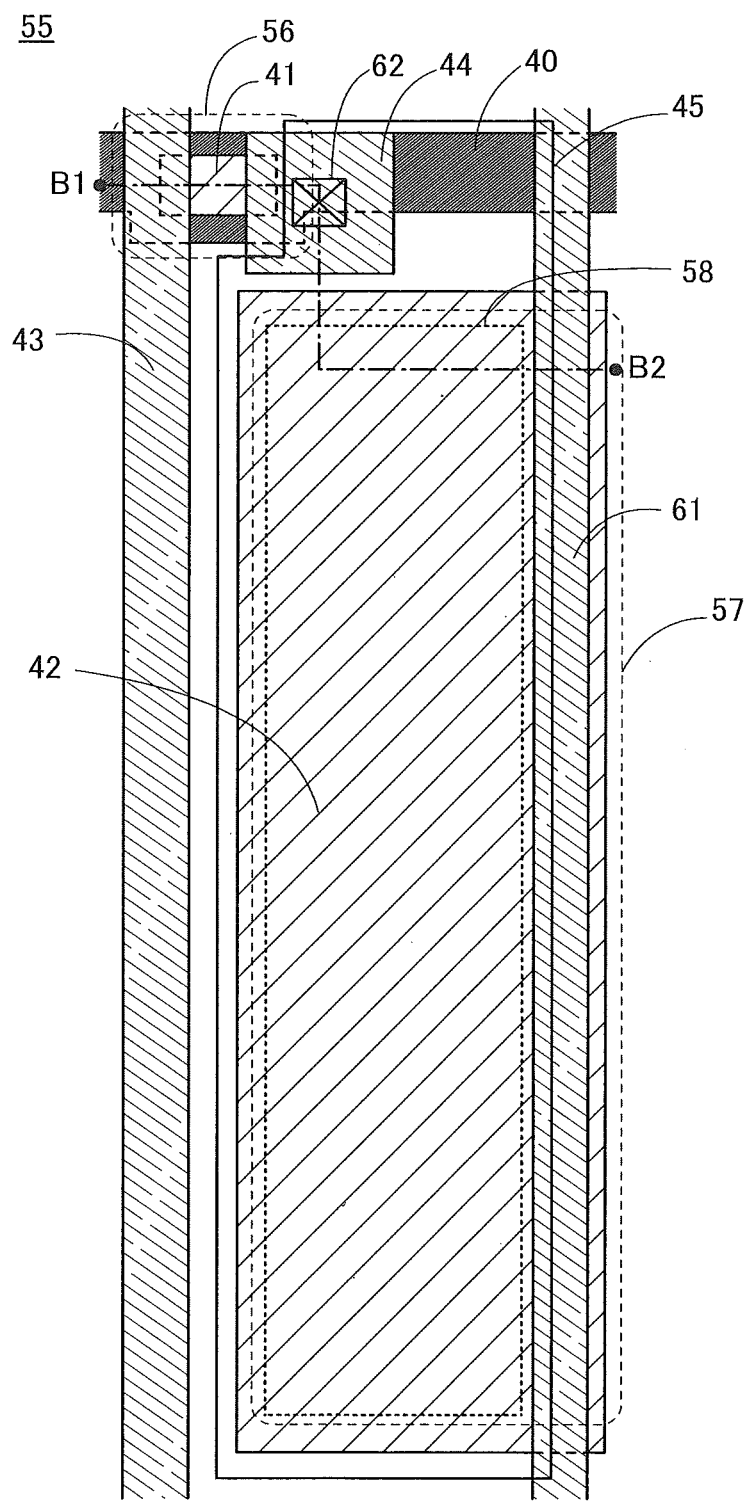
FIG. 14 is a top view of a pixel.
Figure 15:
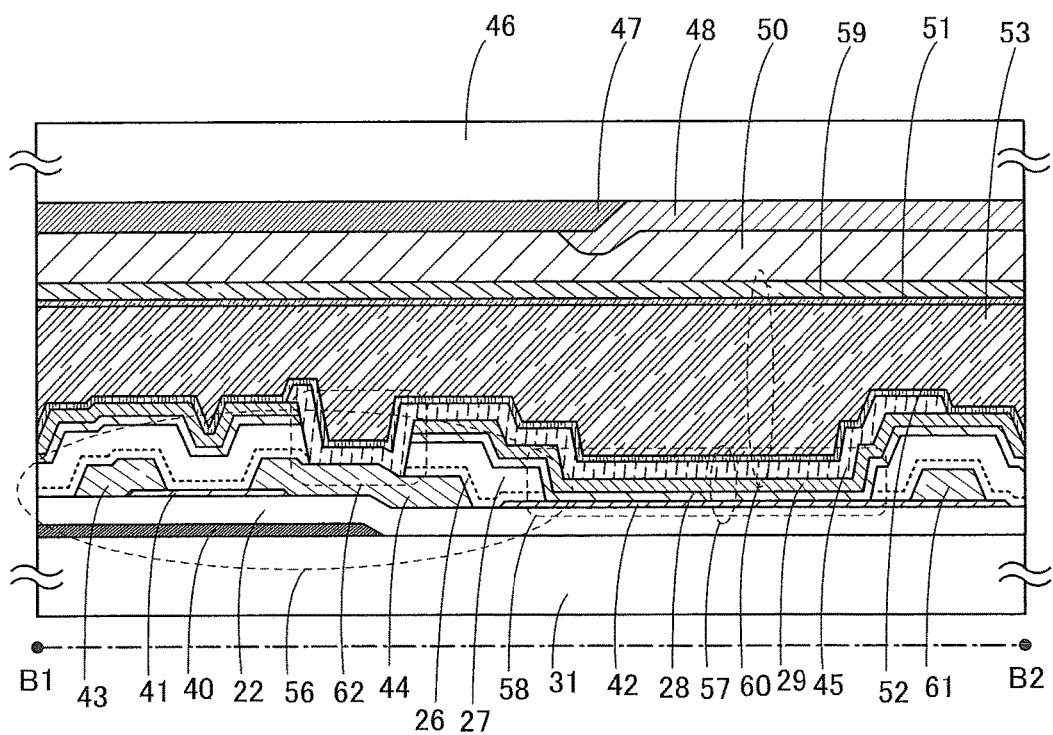
FIG. 15 is a cross-sectional view of a pixel.

Next, description is given of a configuration example of the pixel 55 in a liquid crystal display device that is an example of the semiconductor display device 70 illustrated in FIG. 13A. FIG. 14 illustrates an example of a top view of the pixel 55. Insulating films are not illustrated in FIG. 14 in order to clarify the layout of the pixel 55. FIG. 15 is a cross-sectional view of the liquid crystal display device using an element substrate including the pixel 55 illustrated in FIG. 14. In the liquid crystal display device in FIG. 15, the element substrate including a substrate 31 corresponds to a cross-sectional view along the dashed line B1-B2 in FIG. 14.

The pixel 55 illustrated in FIG. 14 and FIG. 15 includes the transistor 56 and the capacitor 57. In FIG. 15, the pixel 55 includes the liquid crystal element 60.

Over the substrate 31 having an insulating surface, the transistor 56 includes a conductive film 40 serving as a gate electrode, an insulating film 22 that is over the conductive film 40 and serves as a gate insulating film, an oxide semiconductor film 41 that is over the insulating film 22 and overlaps with the conductive film 40, and a conductive film 43 and a conductive film 44 that are electrically connected to the oxide semiconductor film 41 and serve as a source electrode and a drain electrode. The conductive film 40 serves as the wiring GL illustrated in FIG. 13B. The conductive film 43 serves as the wiring SL illustrated in FIG. 13B.

The pixel 55 includes a metal oxide film 42 over the insulating film 22. The metal oxide film 42 is a conductive film that transmits visible light. A conductive film 61 electrically connected to the metal oxide film 42 is provided over the metal oxide film 42. The conductive film 61 serves as a wiring that supplies a predetermined potential to the metal oxide film 42.

The insulating film 22 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Note that in this specification, oxynitride contains more oxygen than nitrogen, and nitride oxide contains more nitrogen than oxygen.

In FIG. 15, an insulating film 26 and an insulating film 27 are stacked in this order provided over the oxide semiconductor film 41, the conductive film 43, the conductive film 44, the metal oxide film 42, and the conductive film 61. The transistor 56 may include the insulating films 26 and 27. Although the insulating films 26 and 27, which are stacked in this order, are illustrated in FIG. 15, a single insulating film or a stack of three or more insulating films may be used instead of the insulating films 26 and 27.

An opening 58 is provided in the insulating films 26 and 27 to overlap with the metal oxide film 42. The opening 58 is provided in a region overlapping with the metal oxide film 42, and the oxide semiconductor film 41, the conductive film 43, and the conductive film 44 are not provided in the region.

In FIG. 15, a nitride insulating film 28 and an insulating film 29 are stacked in this order over the insulating film 26 and the insulating film 27 and over the metal oxide film 42 in the opening 58.

Note that by forming an oxide semiconductor film over the insulating film 22 and forming the nitride insulating film 28 to be in contact with the oxide semiconductor film, the conductivity of the oxide semiconductor film can be increased. In that case, the oxide semiconductor film with high conductivity can be used as the metal oxide film 42. The conductivity of the oxide semiconductor film is increased probably because oxygen vacancies are formed in the oxide semiconductor film at the time of forming the opening 58 or the nitride insulating film 28, and hydrogen diffused from the nitride insulating film 28 is bonded to the oxygen vacancies to form a donor. Specifically, the resistivity of the metal oxide film 42 is higher than or equal to $1 \times 10^{-3}$ Ωcm and lower than $1 \times 10^4$ Ωcm, preferably higher than or equal to $1 \times 10^{-3}$ Ωcm and lower than $1 \times 10^{-1}$ Ωcm.

It is preferable that the metal oxide film 42 have a higher hydrogen concentration than the oxide semiconductor film 41. In the metal oxide film 42, the hydrogen concentration measured by secondary ion mass spectrometry (SIMS) is greater than or equal to $8 \times 10^{19}$ atoms/cm$^3$, preferably greater than or equal to $1 \times 10^{20}$ atoms/cm$^3$, more preferably greater than or equal to $5 \times 10^{20}$ atoms/cm$^3$. In the oxide semiconductor film 41, the hydrogen concentration measured by SIMS is less than $5 \times 10^{19}$ atoms/cm$^3$, preferably less than $5 \times 10^{18}$ atoms/cm$^3$, further preferably less than or equal to $1 \times 10^{18}$ atoms/cm$^3$, still further preferably less than or equal to $5 \times 10^{17}$ atoms/cm$^3$, yet still further preferably less than or equal to $1 \times 10^{16}$ atoms/cm$^3$.

For the nitride insulating film 28, silicon nitride, silicon nitride oxide, aluminum nitride, or aluminum nitride oxide can be used, for example. In comparison with an oxide insulating film such as a silicon oxide film and an aluminum oxide film, the nitride insulating film 28 containing any of the above materials can further prevent impurities from the outside, such as water, alkali metal, and alkaline-earth metal, from being diffused into the oxide semiconductor film 41.

Furthermore, an opening 62 is provided in the nitride insulating film 28 and the insulating film 29 to overlap with the conductive film 44. A conductive film 45 that transmits visible light and serves as a pixel electrode is provided over the nitride insulating film 28 and the insulating film 29. The conductive film 45 is electrically connected to the conductive film 44 in the opening 62. The conductive film 45 overlaps with the metal oxide film 42 in the opening 58. A portion where the conductive film 45 and the metal oxide film 42 overlap with each other with the nitride insulating film 28 and the insulating film 29 sandwiched therebetween serves as the capacitor 57.

In the capacitor 57, the metal oxide film 42 and the conductive film 45 serving as a pair of electrodes and the nitride insulating film 28 and the insulating film 29 collectively serving as a dielectric film transmit visible light. This means that the capacitor 57 transmits visible light. Thus, the aperture ratio of the pixel 55 can be higher than that of a pixel including a capacitor having a property of transmitting less visible light. Therefore, the required capacitance for high image quality can be secured; thus, light loss can be reduced in a panel and power consumption of a semiconductor device can be reduced.

Note that as described above, the insulating film 29 is not necessarily provided. However, with the use of the insulating film 29 using an insulator, which has a dielectric constant lower than that of the nitride insulating film 28, as a dielectric film together with the nitride insulating film 28, the dielectric constant of the dielectric film of the capacitor 57 can be adjusted to a desired value without increasing the thickness of the nitride insulating film 28.

An alignment film 52 is provided over the conductive film 45. A substrate 46 is provided to face the substrate 31. A shielding film 47 blocking visible light and a coloring layer 48 transmitting visible light in a specific wavelength range are provided on the substrate 46. A resin film 50 is provided on the shielding film 47 and the coloring layer 48, and a conductive film 59 serving as a common electrode is provided on the resin film 50. An alignment film 51 is provided on the conductive film 59.

Between the substrates 31 and 46, a liquid crystal layer 53 containing a liquid crystal material is sandwiched between the alignment films 52 and 51. The liquid crystal element 60 includes the conductive film 45, the conductive film 59, and the liquid crystal layer 53.

Although a twisted nematic (TN) mode is used as a method for driving the liquid crystal in FIG. 14 and FIG. 15, the following can be used as a method for driving the liquid crystal: a fringe field switching (FFS) mode, a super twisted nematic (STN) mode, a vertical alignment (VA) mode, a multi-domain vertical alignment (MVA) mode, an in-plane-switching (IPS) mode, an optically compensated birefringence (OCB) mode, a blue phase mode, a transverse bend alignment (TBA) mode, a VA-IPS mode, an electrically controlled birefringence (ECB) mode, a ferroelectric liquid crystal (FLC) mode, an anti-ferroelectric liquid crystal (AFLC) mode, a polymer dispersed liquid crystal (PDLC) mode, a polymer network liquid crystal (PNLC) mode, a guest-host mode, an advanced super view (ASV) mode, and the like.

In the liquid crystal display device of one embodiment of the present invention, the liquid crystal layer can be formed using, for example, a liquid crystal material classified into a thermotropic liquid crystal or a lyotropic liquid crystal. As another example of a liquid crystal material used for the liquid crystal layer, the following can be given: a nematic liquid crystal, a smectic liquid crystal, a cholesteric liquid crystal, or a discotic liquid crystal. Further alternatively, a liquid crystal material categorized by a ferroelectric liquid crystal or an anti-ferroelectric liquid crystal can be used. Further alternatively, a liquid crystal material categorized by a high-molecular liquid crystal such as a main-chain high-molecular liquid crystal, a side-chain high-molecular liquid crystal, or a composite-type high-molecular liquid crystal, or a low-molecular liquid crystal can be used. Further alternatively, a liquid crystal material categorized by a polymer dispersed liquid crystal (PDLC) can be used.

Alternatively, liquid crystal exhibiting a blue phase for which an alignment film is unnecessary may be used for the liquid crystal layer. A blue phase is one of liquid crystal phases, which is generated just before a cholesteric phase changes into an isotropic phase while temperature of cholesteric liquid crystal is increased. Since the blue phase is only generated within a narrow range of temperature, a chiral material or an ultraviolet curable resin is added so that the temperature range is improved. The liquid crystal composition that includes a liquid crystal exhibiting a blue phase and a chiral material is preferable because it has a small response time of less than or equal to 1 msec, has optical isotropy, which makes the alignment process unneeded, and has a small viewing angle dependence.

Although a liquid crystal display device using a color filter to display a color image is illustrated in FIG. 15 as an example, the liquid crystal display device of one embodiment of the present invention may display a color image by sequentially lighting a plurality of light sources having different hues.

Figure 16A:
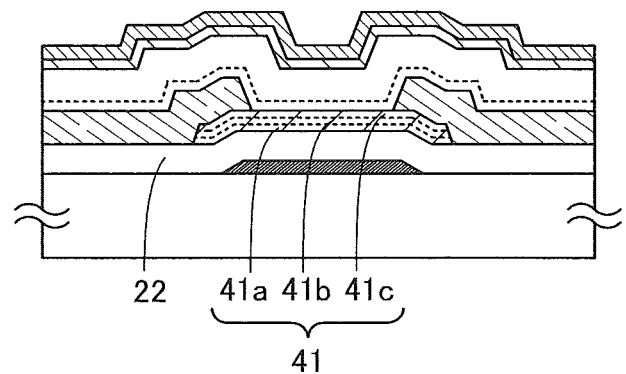
FIGS. 16A and 16B each illustrate a cross-sectional structure of a transistor.

The oxide semiconductor film 41 of the transistor 56 is not necessarily a single oxide semiconductor film, but may be a stack of a plurality of oxide semiconductor films. FIG. 16A illustrates an example in which the oxide semiconductor film 41 is formed using a stack of three oxide semiconductor films. Specifically, in the transistor 56 in FIG. 16A, oxide semiconductor films 41a, 41b, and 41c are stacked sequentially from the insulating film 22 side as the oxide semiconductor film 41.

The oxide semiconductor films 41a and 41c each contain at least one of metal elements contained in the oxide semiconductor film 41b. The energy at the bottom of the conduction band of the oxide semiconductor films 41a and 41c is closer to a vacuum level than that of the oxide semiconductor film 41b by 0.05 eV or more, 0.07 eV or more, 0.1 eV or more, or 0.15 eV or more and 2 eV or less, 1 eV or less, 0.5 eV or less, or 0.4 eV or less. Furthermore, the oxide semiconductor film 41b preferably contains at least indium in order that the carrier mobility is high.

Figure 16B:
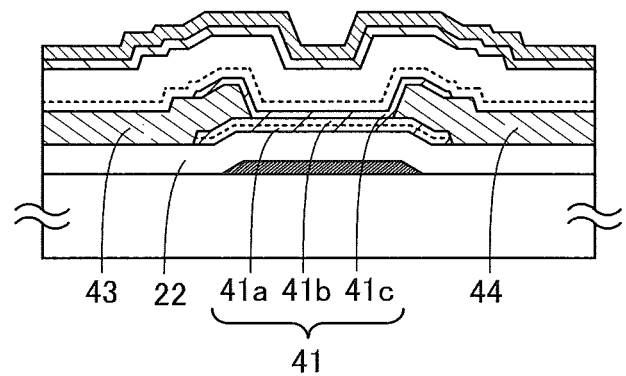

As illustrated in FIG. 16B, the oxide semiconductor film 41c overlapping with the insulating film 22 may be provided over the conductive films 43 and 44.

This embodiment can be implemented in appropriate combination with any of the structures described in the other embodiments and the like in this specification and the like.

(Embodiment 5)

<Top and Cross-Sectional Views of Semiconductor Display Device>

Figure 17:
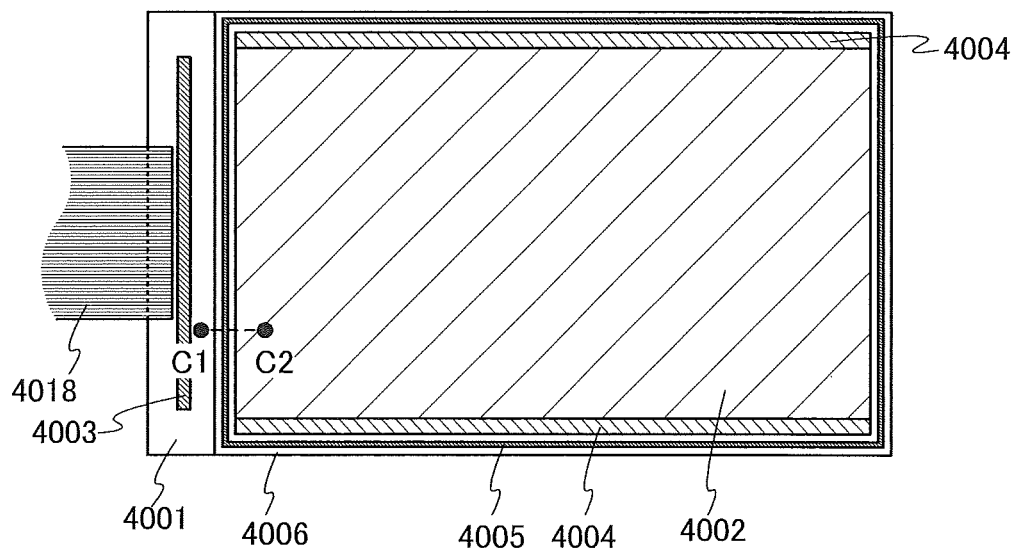
FIG. 17 is a top view of a liquid crystal display device.
Figure 18:
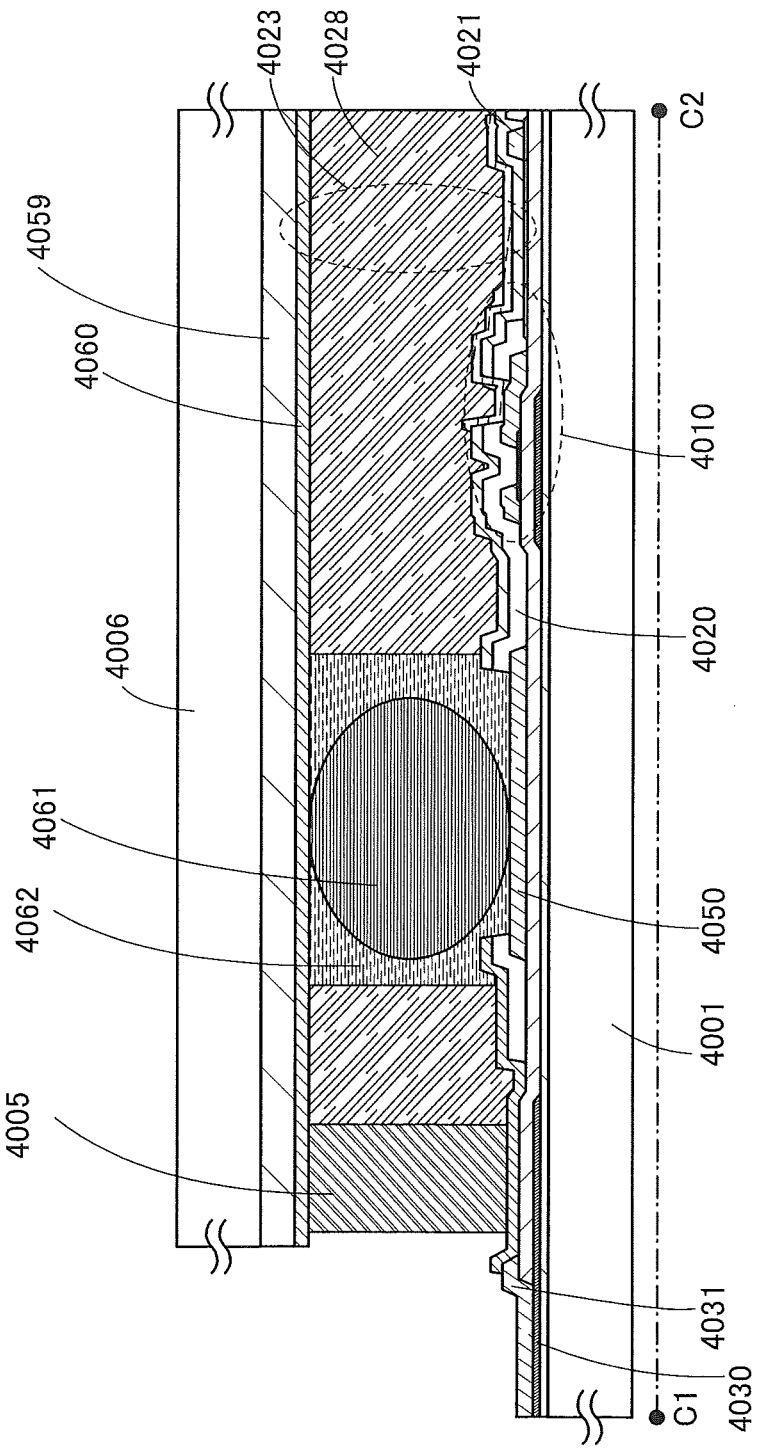
FIG. 18 is a cross-sectional view of a liquid crystal display device.

The appearance of a semiconductor display device of one embodiment of the present invention is described with reference to FIG. 17. FIG. 17 is a top view of a liquid crystal display device where a substrate 4001 and a substrate 4006 are bonded to each other with a sealant 4005. FIG. 18 corresponds to a cross-sectional view taken along dashed line C1-C2 in FIG. 17.

The sealant 4005 is provided to surround a pixel portion 4002 and a pair of driver circuits 4004 provided over the substrate 4001. The substrate 4006 is provided over the pixel portion 4002 and the driver circuits 4004. Thus, the pixel portion 4002 and the driver circuits 4004 are sealed by the substrate 4001, the sealant 4005, and the substrate 4006.

A driver circuit 4003 is mounted in a region that is different from the region surrounded by the sealant 4005 over the substrate 4001.

A plurality of transistors are included in the pixel portion 4002 and the driver circuits 4004 provided over the substrate 4001. FIG. 18 illustrates a transistor 4010 included in the pixel portion 4002. An insulating film 4020 that can be formed using a variety of insulating films including a nitride insulating film is provided over the transistor 4010. The transistor 4010 is connected to a pixel electrode 4021 over the insulating film 4020 in an opening portion provided in the insulating film 4020.

A resin film 4059 is provided on the substrate 4006, and a common electrode 4060 is provided on the resin film 4059. A liquid crystal layer 4028 between the pixel electrode 4021 and the common electrode 4060 is provided between the substrates 4001 and 4006. A liquid crystal element 4023 includes the pixel electrode 4021, the common electrode 4060, and the liquid crystal layer 4028.

The transmittance of the liquid crystal element 4023 changes when the alignment of liquid crystal molecules included in the liquid crystal layer 4028 changes in accordance with the level of a voltage applied between the pixel electrode 4021 and the common electrode 4060. Accordingly, when the transmittance of the liquid crystal element 4023 is controlled by the potential of a video signal supplied to the pixel electrode 4021, gray-scale images can be displayed.

As illustrated in FIG. 18, in one embodiment of the present invention, the insulating film 4020 is removed at an end portion of the panel. A conductive film 4050 is formed in the region where the insulating film 4020 is removed. The conductive film 4050 and a conductive film serving as a source or a drain of the transistor 4010 can be formed by etching one conductive film.

A resin film 4062 in which conductive particles 4061 having conductivity are dispersed is provided between the substrate 4001 and the substrate 4006. The conductive film 4050 is electrically connected to the common electrode 4060 through the conductive particles 4061. In other words, the common electrode 4060 and the conductive film 4050 are electrically connected to each other through the conductive particle 4061 at the end portion of the panel. The resin film 4062 can be formed using a thermosetting resin or an ultraviolet curable resin. As the conductive particle 4061, a particle of a spherical organic resin coated with thin-film metal of Au, Ni, Co, or the like can be used, for example.

An alignment film is not illustrated in FIG. 18. In the case of providing alignment films on the pixel electrode 4021 and the common electrode 4060, the alignment film on the common electrode 4060 is partly removed and the alignment film on the conductive film 4050 is partly removed; thus, electrical connection can be obtained among the common electrode 4060, the conductive particle 4061, and the conductive film 4050.

Note that in the liquid crystal display device of one embodiment of the present invention, a color image may be displayed by using a color filter or by sequentially turning on a plurality of light sources emitting light with different hues.

Video signals from the driver circuit 4003 and a variety of control signals and potentials from an FPC 4018 are supplied to the driver circuits 4004 or the pixel portion 4002 through lead wirings 4030 and 4031.

This embodiment can be implemented in appropriate combination with any of the structures described in the other embodiments and the like in this specification and the like.
(Embodiment 6)

In this embodiment, an oxide semiconductor layer that can be used as any of the semiconductor layers of the transistors described in the above embodiments is described.

An oxide semiconductor used for a channel formation region in the semiconductor layer of the transistor preferably contains at least indium (In) or zinc (Zn). In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tin—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, In:Ga:Zn=3:1:2, or In:Ga:Zn=2:1:3, or an oxide whose composition is in the neighborhood of the above composition is preferably used.

When an oxide semiconductor film included in the semiconductor layer contains a large amount of hydrogen, hydrogen and the oxide semiconductor are bonded to each other, so that part of hydrogen serves as a donor and causes an electron (carrier). As a result, the threshold voltage of the transistor is shifted in a negative direction. Thus, it is preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is reduced by the dehydration treatment (dehydrogenation treatment) in some cases. Thus, it is preferable that oxygen be added to the oxide semiconductor film to fill oxygen vacancies increased by the dehydration treatment (dehydrogenation treatment). In this specification and the like, supplying oxygen to an oxide semiconductor film is expressed as oxygen adding treatment, and treatment for making the oxygen content of an oxide semiconductor film be in excess of that in the stoichiometric composition is expressed as treatment for making an oxygen-excess state in some cases.

In this manner, hydrogen or moisture is removed from the oxide semiconductor film by dehydration treatment (dehydrogenation treatment) and oxygen vacancies are filled by oxygen adding treatment, so that the oxide semiconductor film can be an intrinsic (i-type) oxide semiconductor film or a substantially intrinsic (i-type) oxide semiconductor film that is extremely close to an i-type oxide semiconductor film. Note that the substantially intrinsic oxide semiconductor film means an oxide semiconductor film that contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

In this manner, the transistor including an intrinsic (i-type) or substantially i-type oxide semiconductor film can have extremely favorable off-state current characteristics. For example, the drain current when the transistor including an oxide semiconductor film is off can be less than or equal to $1\times10^{-18}$ A, preferably less than or equal to $1\times10^{-21}$ A, and more preferably less than or equal to $1\times10^{-24}$ A at room temperature (approximately 25° C.); or less than or equal to $1\times10^{-15}$ A, preferably less than or equal to $1\times10^{-18}$ A, more preferably less than or equal to $1\times10^{-21}$ A at 85° C. The off state of a transistor refers to a state where gate voltage is much lower than the threshold voltage in an n-channel transistor. Specifically, when the gate voltage is lower than the threshold voltage by 1 V or more, 2 V or more, or 3 V or more, the transistor is off.

The structure of the oxide semiconductor film is described below.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting a surface over which the CAAC-OS film is foamed (also referred to as a formation surface) or a top surface of the CAAC-OS film, and is provided in parallel to the foliation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources, and thus can have low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has few variations in electrical characteristics and high reliability. Charge trapped by the carrier traps in the oxide semiconductor film takes a long time to be released and may behave like fixed charge. Thus, the transistor that includes the oxide semiconductor film having high impurity concentration and high density of defect states has unstable electrical characteristics in some cases.

In a transistor including the CAAC-OS film, changes in electrical characteristics of the transistor due to irradiation with visible light or ultraviolet light are small.

Next, a microcrystalline oxide semiconductor film is described.

A microcrystalline oxide semiconductor film has a region in which a crystal part is observed and a region in which a crystal part is not observed clearly in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image of the nc-OS film, a grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity than an amorphous oxide semiconductor film. Thus, the nc-OS film has a lower density of defect states than the amorphous oxide semiconductor film. Note that there is no regularity of crystal orientation between different crystal parts in the nc-OS film; thus, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS or a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as a d value). The value is calculated to be 0.29 nm from crystal structure analysis. Thus, each of the lattice fringes in which the spacing therebetween is from 0.28 nm to 0.30 nm corresponds to the a-b plane of the $InGaZnO_4$ crystal, focusing on the lattice fringes in the high-resolution TEM image.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single-crystal oxide semiconductor film having the same composition as the oxide semiconductor film. For example, the density of an a-like OS film is higher than or equal to 78.6% and lower than 92.3% of that of the single-crystal oxide semiconductor film. In addition, for example, the density of an nc-OS film or a CAAC-OS film is higher than or equal to 92.3% and lower than 100% of that of the single-crystal oxide semiconductor film. Note that it is difficult to deposit an oxide semiconductor film whose density is lower than 78% of that of the single-crystal oxide semiconductor film Specific examples of the above are described. For example, in the case of an oxide semiconductor film with an atomic ratio of In:Ga:Zn=1:1:1, the density of single-crystal $InGaZnO_4$ with a rhombohedral crystal structure is 6.357 $g/cm^3$. Thus, for example, in the case of the oxide semiconductor film with an atomic ratio of In:Ga:Zn=1:1:1, the density of an a-like OS film is higher than or equal to 5.0 $g/cm^3$ and lower than 5.9 $g/cm^3$. In addition, for example, in the case of the oxide semiconductor film with an atomic ratio of In:Ga:Zn=1:1:1, the density of an nc-OS film or a CAAC-OS film is higher than or equal to 5.9 $g/cm^3$ and lower than 6.3 $g/cm^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

In this specification, the term "parallel" indicates that an angle formed between two straight lines is −10° to 10°, and accordingly includes the case where the angle is −5° to 5°. The term "substantially parallel" indicates that an angle formed between two straight lines is −30° to 30°. In addition, the term "perpendicular" indicates that an angle formed between two straight lines is 80° to 100°, and accordingly includes the case where the angle is 85° to 95°. The term "substantially perpendicular" indicates that an angle formed between two straight lines is 60° to 120°.

In this specification, trigonal and rhombohedral crystal systems are included in a hexagonal crystal system.

This embodiment can be implemented in appropriate combination with any of the structures described in the other embodiments and the like in this specification and the like.

(Embodiment 7)

<Structure Example of Electronic Device Using Semiconductor Device>

The semiconductor device of one embodiment of the present invention can be used for display devices, personal computers, or image reproducing devices provided with recording media (typically, devices that include displays, and can reproduce the content of recording media such as digital versatile discs (DVDs) and display the reproduced images). In addition, examples of electronic devices in which the semiconductor device of one embodiment of the present invention can be used include cellular phones, game machines (including portable game machines), personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), and vending machines. Specific examples of these electronic devices are illustrated in FIGS. 19A to 19F.

Figure 19A:
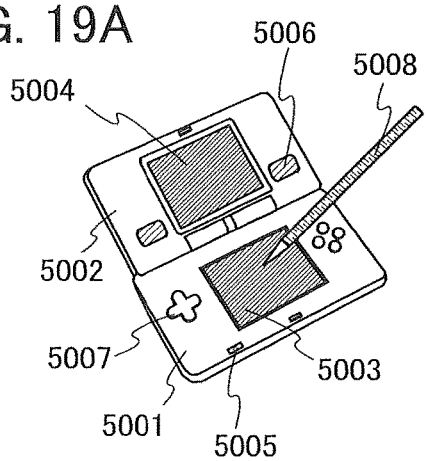
FIGS. 19A to 19F each illustrate an electronic device.

FIG. 19A illustrates a portable game machine, which includes a housing 5001, a housing 5002, a display portion 5003, a display portion 5004, a microphone 5005, speakers 5006, an operation key 5007, a stylus 5008, and the like. The semiconductor device of one embodiment of the present invention can be used for the display portion 5003, the display portion 5004, or an integrated circuit in another portion. Note that although the portable game machine in FIG. 19A has the two display portions 5003 and 5004, the number of display portions included in the portable game machine is not limited thereto.

Figure 19B:
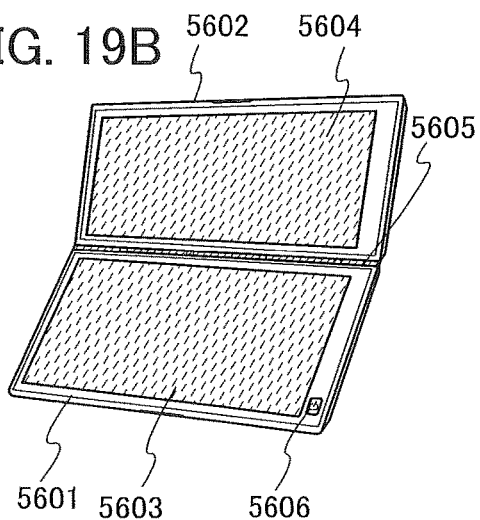

FIG. 19B illustrates a personal digital assistant, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. Images on the first display portion 5603 may be switched in accordance with the angle at the joint 5605 between the first housing 5601 and the second housing 5602. The semiconductor device of one embodiment of the present invention can be used for the first display portion 5603, the second display portion 5604, or an integrated circuit in another portion.

Figure 19C:
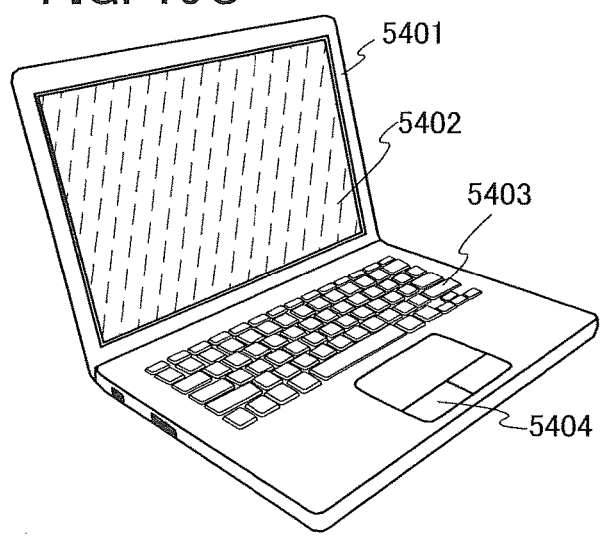

FIG. 19C illustrates a laptop personal computer, which includes a housing 5401, a display portion 5402, a keyboard 5403, a pointing device 5404, and the like. The semiconductor device of one embodiment of the present invention can be used for the display portion 5402 or an integrated circuit in another portion.

Figure 19D:
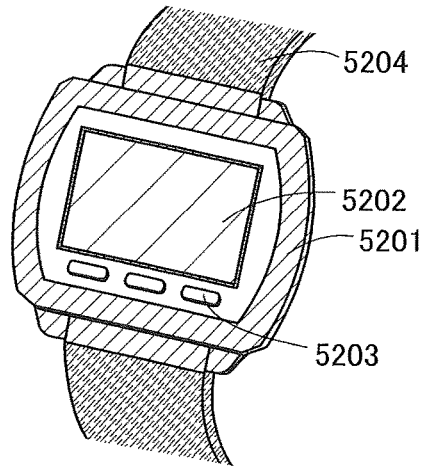

FIG. 19D illustrates a wristwatch, which includes a housing 5201, a display portion 5202, an operation button 5203, a bracelet 5204, and the like. The semiconductor device of one embodiment of the present invention can be used for the display portion 5202 or an integrated circuit in another portion.

Figure 19E:
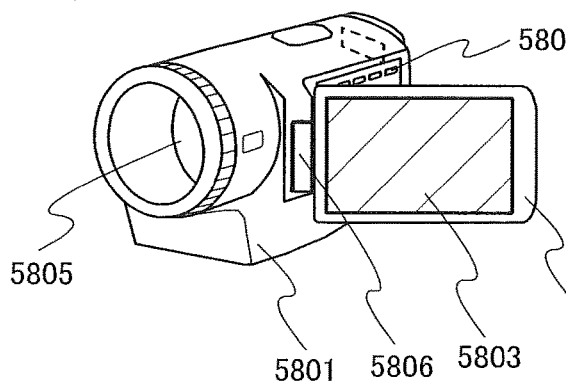

FIG. 19E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 is connected to the second housing 5802 with the joint 5806, and the angle between the first housing 5801 and the second housing 5802 can be changed at the joint 5806. Images on the display portion 5803 may be switched in accordance with the angle at the joint 5806 between the first housing 5801 and the second housing 5802. The semiconductor device of one embodiment of the present invention can be used for the display portion 5803 or an integrated circuit in another portion.

Figure 19F:
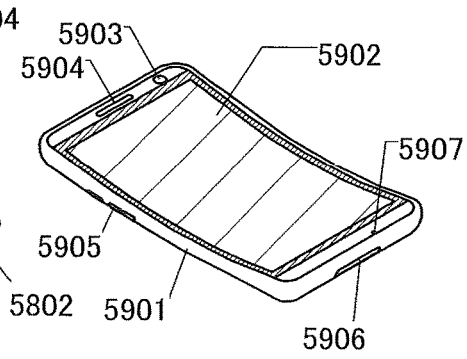

FIG. 19F illustrates a cellular phone. In the cellular phone, a display portion 5902, a microphone 5907, a speaker 5904, a camera 5903, an external connection portion 5906, and an operation button 5905 are provided in a housing 5901. The semiconductor device of one embodiment of the present invention can be used for the display portion 5902 or an integrated circuit in another portion. When the semiconductor device of one embodiment of the present invention is provided over a flexible substrate, the semiconductor device can be used as the display portion 5902 having a curved surface, as illustrated in FIG. 19F.

Note that what is described (or part thereof) in one embodiment can be applied to, combined with, or replaced with different contents in the embodiment and/or what is described (or part thereof) in another embodiment or other embodiments.

Note that in each embodiment, what is described in the embodiment is contents described with reference to a variety of diagrams or contents described with text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in another embodiment or other embodiments, much more diagrams can be formed.

Note that contents that are not specified in any drawing or text in the specification can be excluded from one embodiment of the invention. Alternatively, when the range of a value that is defined by the maximum and minimum values is described, part of the range is appropriately narrowed and part of the range is removed, whereby one embodiment of the invention can be constituted excluding part of the range can be constructed. In this manner, it is possible to specify the technical scope of one embodiment of the present invention so that a conventional technology is excluded, for example.

As a specific example, a diagram of a circuit including first to fifth transistors is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, the description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, the description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, the description "a film is an insulating film" is given to describe a property of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a layered film of four or more layers is excluded from the invention. For example, it can be specified that the case where a conductive film is provided between the A film and the film is excluded from the invention.

Note that in this specification and the like, it may be possible for those skilled in the art to constitute one embodiment of the invention even when portions to which all the terminals of an active element (e.g., a transistor or a diode), a passive element (e.g., a capacitor or a resistor), are the like are connected are not specified. In other words, one embodiment of the invention is clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected may be more than one, it is not necessary to specify the portions to which the terminal is connected. Therefore, it may be possible to constitute one embodiment of the invention by specifying only portions to which some of terminals of an active element (e.g., a transistor or a diode), a passive element (e.g., a capacitor or a resistor), and the like are connected.

Note that in this specification and the like, it may be possible for those skilled in the art to specify the invention when at least the connection portion of a circuit is specified. Alternatively, it may be possible for those skilled in the art to specify the invention when at least a function of a circuit is specified. In other words, when a function of a circuit is specified, one embodiment of the present invention is clear. Moreover, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, part of a diagram or text described in one embodiment can be taken out to constitute one embodiment of the invention. Thus, in the case where a diagram or text related to a certain portion is described, the contents taken out from part of the diagram or the text are also disclosed as one embodiment of the invention, and one embodiment of the invention can be constituted. The embodiment of the present invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to take out M circuit elements (e.g., transistors or capacitors; M is an integer, where M<N) and constitute one embodiment of the invention. For another example, it is possible to take out M layers (M is an integer, where M<N) from a cross-sectional view in which N layers (N is an integer) are provided and constitute one embodiment of the invention. For another example, it is possible to take out M elements (M is an integer, where M<N) from a flow chart in which N elements (N is an integer) are provided and constitute one embodiment of the invention. For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, what is illustrated in at least a diagram (which may be part of the diagram) is disclosed as one embodiment of the invention, and one embodiment of the invention can be constituted. Therefore, when certain contents are described in a diagram, the contents are disclosed as one embodiment of the invention even when the contents are not described with text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

This application is based on Japanese Patent Application serial no. 2014-031501 filed with Japan Patent Office on Feb. 21, 2014, the entire contents of which are hereby incorporated by reference.

What is claimed is:

1. A semiconductor device comprising:
a first transistor, a second transistor, a third transistor, and a fourth transistor; and
a first wiring and a second wiring,
wherein one of a source and a drain of the first transistor is electrically connected to one of a source and a drain of the second transistor,
wherein the other of the source and the drain of the first transistor and a gate of the third transistor are electrically connected to the first wiring,
wherein a gate of the first transistor is electrically connected to one of a source and a drain of the fourth transistor,
wherein the other of the source and the drain of the second transistor and one of a source and a drain of the third transistor are electrically connected to the second wiring,
wherein a gate of the second transistor is electrically connected to a gate of the fourth transistor, and
wherein the other of the source and the drain of the third transistor is electrically connected to the other of the source and the drain of the fourth transistor.

2. The semiconductor device according to claim 1, wherein the first transistor, the second transistor, the third transistor, and the fourth transistor have the same conductivity type.

3. The semiconductor device according to claim 1, wherein a ratio of a channel width to a channel length of the fourth transistor is higher than a ratio of a channel width to a channel length of the third transistor.

4. The semiconductor device according to claim 1,
wherein the third transistor comprises a first semiconductor layer and a first gate electrode,
wherein the fourth transistor comprises a second semiconductor layer and a second gate electrode, and
wherein an area where the second semiconductor layer and the second gate electrode overlap with each other is larger than an area where the first semiconductor layer and the first gate electrode overlap with each other.

5. The semiconductor device according to claim 1, wherein a channel formation region of at least one of the first transistor, the second transistor, the third transistor, and the fourth transistor comprises an oxide semiconductor.

6. The semiconductor device according to claim 1,
wherein the first wiring is configured to supply a clock signal to the other of the source and the drain of the first transistor and the gate of the third transistor, and
wherein the second wiring is configured to supply a voltage to the other of the source and the drain of the second transistor and the one of the source and the drain of the third transistor.

7. A semiconductor device comprising:
a first transistor, a second transistor, a third transistor, and a fourth transistor; and
a first wiring, a second wiring, and a third wiring,
wherein one of a source and a drain of the first transistor is electrically connected to one of a source and a drain of the second transistor,
wherein the other of the source and the drain of the first transistor is electrically connected to the first wiring,
wherein a gate of the first transistor is electrically connected to one of a source and a drain of the fourth transistor,
wherein the other of the source and the drain of the second transistor and one of a source and a drain of the third transistor are electrically connected to the second wiring,
wherein a gate of the second transistor is electrically connected to a gate of the fourth transistor,
wherein the other of the source and the drain of the third transistor is electrically connected to the other of the source and the drain of the fourth transistor,
wherein a gate of the third transistor is electrically connected to the third wiring, and
wherein the gate of the third transistor is not electrically connected to the gate of the fourth transistor.

8. The semiconductor device according to claim 7, wherein the first transistor, the second transistor, the third transistor, and the fourth transistor have the same conductivity type.

9. The semiconductor device according to claim 7, wherein a ratio of a channel width to a channel length of the fourth transistor is higher than a ratio of a channel width to a channel length of the third transistor.

10. The semiconductor device according to claim 7,
wherein the third transistor comprises a first semiconductor layer and a first gate electrode,
wherein the fourth transistor comprises a second semiconductor layer and a second gate electrode, and
wherein an area where the second semiconductor layer and the second gate electrode overlap with each other is larger than an area where the first semiconductor layer and the first gate electrode overlap with each other.

11. The semiconductor device according to claim 7, wherein a channel formation region of at least one of the first transistor, the second transistor, the third transistor, and the fourth transistor comprises an oxide semiconductor.

12. The semiconductor device according to claim 7,
wherein the first wiring is configured to supply a first clock signal to the other of the source and the drain of the first transistor,
wherein the second wiring is configured to supply a voltage to the other of the source and the drain of the second transistor and the one of the source and the drain of the third transistor, and
wherein the third wiring is configured to supply a second clock signal to the gate of the third transistor.

13. A semiconductor device comprising:
a first transistor, a second transistor, a third transistor, a fourth transistor, a fifth transistor, a sixth transistor, and a seventh transistor; and
a first wiring, a second wiring; a third wiring, and a fourth wiring,
wherein one of a source and a drain of the first transistor is electrically connected to one of a source and a drain of the second transistor,
wherein the other of the source and the drain of the first transistor and a gate of the third transistor are electrically connected to the first wiring,
wherein a gate of the first transistor is electrically connected to one of a source and a drain of the fourth transistor,
wherein the other of the source and the drain of the second transistor and one of a source and a drain of the third transistor are electrically connected to the second wiring,
wherein a gate of the second transistor is electrically connected to a gate of the fourth transistor, one of a source and a drain of the sixth transistor, and one of a source and a drain of the seventh transistor,
wherein the other of the source and the drain of the third transistor is electrically connected to the other of the source and the drain of the fourth transistor,
wherein one of a source and a drain of the fifth transistor is electrically connected to a gate of the seventh transistor,
wherein the other of the source and the drain of the fifth transistor is electrically connected to the fourth wiring, and
wherein a gate of the sixth transistor is electrically connected to the third wiring.

14. The semiconductor device according to claim 13, wherein the first transistor, the second transistor, the third transistor, the fourth transistor, the fifth transistor, the sixth transistor, and the seventh transistor have the same conductivity type.

15. The semiconductor device according to claim 13, wherein a ratio of a channel width to a channel length of the fourth transistor is higher than a ratio of a channel width to a channel length of the third transistor.

16. The semiconductor device according to claim 13,
wherein the third transistor comprises a first semiconductor layer and a first gate electrode,
wherein the fourth transistor comprises a second semiconductor layer and a second gate electrode, and
wherein an area where the second semiconductor layer and the second gate electrode overlap with each other is larger than an area where the first semiconductor layer and the first gate electrode overlap with each other.

17. The semiconductor device according to claim 13, wherein a channel formation region of at least one of the first transistor, the second transistor, the third transistor, the fourth transistor, the fifth transistor, the sixth transistor, and the seventh transistor comprises an oxide semiconductor.

18. The semiconductor device according to claim 13,
wherein the first wiring is configured to supply a first clock signal to the other of the source and the drain of the first transistor,
wherein the second wiring is configured to supply a voltage to the other of the source and the drain of the second transistor and the one of the source and the drain of the third transistor,
wherein the third wiring is configured to supply a second clock signal to the gate of the sixth transistor, and
wherein the fourth wiring is configured to supply a start pulse to the other of the source and the drain of the fourth transistor.

* * * * *